(12) United States Patent
Pickett et al.

(10) Patent No.: US 8,847,197 B2
(45) Date of Patent: Sep. 30, 2014

(54) SEMICONDUCTOR NANOPARTICLE-BASED MATERIALS

(75) Inventors: Nigel Pickett, East Croydon (GB); Imad Naasani, Manchester (GB); James Harris, Manchester (GB)

(73) Assignee: Nanoco Technologies Ltd. (GB)

( * ) Notice: Subject to any disclaimer, the term of this patent is extended or adjusted under 35 U.S.C. 154(b) by 442 days.

(21) Appl. No.: 12/888,881

(22) Filed: Sep. 23, 2010

(65) Prior Publication Data

US 2011/0068321 A1  Mar. 24, 2011

Related U.S. Application Data

(60) Provisional application No. 61/246,287, filed on Sep. 28, 2009.

(30) Foreign Application Priority Data

Sep. 23, 2009 (GB) .................................. 0916699.2

(51) Int. Cl.
| | |
|---|---|
| H01L 29/06 | (2006.01) |
| H01L 31/00 | (2006.01) |
| C09K 11/88 | (2006.01) |
| C09K 11/56 | (2006.01) |
| C09K 11/70 | (2006.01) |
| C09K 11/02 | (2006.01) |
| H01L 33/50 | (2010.01) |

(52) U.S. Cl.
CPC ............. *C09K 11/883* (2013.01); *C09K 11/565* (2013.01); *C09K 11/70* (2013.01); *H01L 33/504* (2013.01); *C09K 11/025* (2013.01)
USPC ..................................... 257/13; 257/E33.008

(58) Field of Classification Search
USPC .......... 257/40, E33.008, 789, 13, 9; 977/786, 977/787, 834
See application file for complete search history.

(56) References Cited

U.S. PATENT DOCUMENTS

| | | | |
|---|---|---|---|
| 2,769,838 | A | 11/1956 | Matter et al. |
| 3,524,771 | A | 8/1970 | Green |
| 4,609,689 | A | 9/1986 | Schwartz et al. |
| 6,114,038 | A | 9/2000 | Castro et al. |
| 6,207,229 | B1 | 3/2001 | Bawendi et al. |

(Continued)

FOREIGN PATENT DOCUMENTS

| | | |
|---|---|---|
| AU | 2009317049 A1 | 5/2010 |
| CN | 1394599 | 2/2003 |

(Continued)

OTHER PUBLICATIONS

Agger, J.R. et al., J. Phys. Chem. B (1998) 102, p. 3345.

(Continued)

*Primary Examiner* — Daniel Luke
*Assistant Examiner* — Latanya N Crawford
(74) *Attorney, Agent, or Firm* — Wong, Cabello, Lutsch, Rutherford & Brucculeri LLP.

(57) ABSTRACT

In various embodiment, a primary particle includes a primary matrix material containing a population of semiconductor nanoparticles, with each primary particle further comprising an additive to enhance the physical, chemical and/or photo-stability of the semiconductor nanoparticles. A method of preparing such particles is described. Composite materials and light-emitting devices incorporating such primary particles are also described.

25 Claims, 6 Drawing Sheets

(56) References Cited

U.S. PATENT DOCUMENTS

| | | | |
|---|---|---|---|
| 6,221,602 B1 | 4/2001 | Barbera-Guillem et al. | |
| 6,261,779 B1 | 7/2001 | Barbera-Guillem et al. | |
| 6,322,901 B1 | 11/2001 | Bawendi et al. | |
| 6,326,144 B1 | 12/2001 | Bawendi et al. | |
| 6,333,110 B1 | 12/2001 | Barbera-Guillem | |
| 6,379,635 B2 | 4/2002 | O'Brien et al. | |
| 6,423,551 B1 | 7/2002 | Weiss et al. | |
| 6,426,513 B1 | 7/2002 | Bawendi et al. | |
| 6,607,829 B1 | 8/2003 | Bawendi et al. | |
| 6,660,379 B1 | 12/2003 | Lakowicz et al. | |
| 6,699,723 B1 | 3/2004 | Weiss et al. | |
| 6,815,064 B2 | 11/2004 | Treadway et al. | |
| 6,855,551 B2 | 2/2005 | Bawendi et al. | |
| 6,914,264 B2 | 7/2005 | Chen et al. | |
| 6,992,202 B1 | 1/2006 | Banger et al. | |
| 7,151,047 B2 | 12/2006 | Chan et al. | |
| 7,235,361 B2 | 6/2007 | Bawendi et al. | |
| 7,264,527 B2 | 9/2007 | Bawendi et al. | |
| 7,544,725 B2 | 6/2009 | Pickett et al. | |
| 7,588,828 B2 | 9/2009 | Mushtaq et al. | |
| 7,674,844 B2 | 3/2010 | Pickett et al. | |
| 7,803,423 B2 | 9/2010 | O'Brien et al. | |
| 7,867,556 B2 | 1/2011 | Pickett | |
| 7,867,557 B2 | 1/2011 | Pickett et al. | |
| 2003/0017264 A1 | 1/2003 | Treadway et al. | |
| 2003/0106488 A1 | 6/2003 | Huang et al. | |
| 2003/0132538 A1 | 7/2003 | Chandler | |
| 2003/0148024 A1 | 8/2003 | Kodas et al. | |
| 2004/0007169 A1 | 1/2004 | Ohtsu et al. | |
| 2004/0036085 A1* | 2/2004 | Sato et al. | 257/200 |
| 2004/0036130 A1 | 2/2004 | Lee et al. | |
| 2004/0110002 A1 | 6/2004 | Kim et al. | |
| 2004/0110347 A1 | 6/2004 | Yamashita | |
| 2004/0178390 A1 | 9/2004 | Whiteford et al. | |
| 2004/0250745 A1 | 12/2004 | Ogura et al. | |
| 2005/0098204 A1 | 5/2005 | Roscheisen et al. | |
| 2005/0129947 A1 | 6/2005 | Peng et al. | |
| 2005/0145853 A1 | 7/2005 | Sato et al. | |
| 2006/0019098 A1 | 1/2006 | Chan et al. | |
| 2006/0057382 A1 | 3/2006 | Treadway et al. | |
| 2006/0061017 A1 | 3/2006 | Strouse et al. | |
| 2006/0068154 A1 | 3/2006 | Parce et al. | |
| 2006/0110279 A1 | 5/2006 | Han et al. | |
| 2006/0118757 A1 | 6/2006 | Klimov et al. | |
| 2006/0130741 A1 | 6/2006 | Peng et al. | |
| 2006/0172133 A1* | 8/2006 | Naasani | 428/403 |
| 2006/0257485 A1* | 11/2006 | Kumacheva | 424/486 |
| 2007/0012941 A1 | 1/2007 | Cheon | |
| 2007/0034833 A1* | 2/2007 | Parce et al. | 252/301.36 |
| 2007/0059705 A1 | 3/2007 | Lu et al. | |
| 2007/0104865 A1 | 5/2007 | Pickett | |
| 2007/0110816 A1 | 5/2007 | Jun et al. | |
| 2007/0114520 A1 | 5/2007 | Garditz et al. | |
| 2007/0125983 A1 | 6/2007 | Treadway et al. | |
| 2007/0131905 A1 | 6/2007 | Sato et al. | |
| 2007/0199109 A1 | 8/2007 | Yi et al. | |
| 2007/0202333 A1 | 8/2007 | O'Brien et al. | |
| 2007/0238126 A1 | 10/2007 | Pickett et al. | |
| 2007/0243382 A1* | 10/2007 | Chan et al. | 428/403 |
| 2008/0107911 A1 | 5/2008 | Liu et al. | |
| 2008/0112877 A1 | 5/2008 | Xiao et al. | |
| 2008/0121844 A1 | 5/2008 | Jang et al. | |
| 2008/0149850 A1* | 6/2008 | Tardif et al. | 250/459.1 |
| 2008/0160306 A1 | 7/2008 | Mushtaq et al. | |
| 2008/0190483 A1 | 8/2008 | Carpenter et al. | |
| 2008/0193762 A1* | 8/2008 | Dubertret et al. | 428/402.24 |
| 2008/0220593 A1 | 9/2008 | Pickett et al. | |
| 2008/0230750 A1 | 9/2008 | Gillies et al. | |
| 2008/0257201 A1 | 10/2008 | Harris et al. | |
| 2008/0264479 A1 | 10/2008 | Harris et al. | |
| 2009/0121625 A1* | 5/2009 | Ohrui et al. | 313/504 |
| 2009/0139574 A1 | 6/2009 | Pickett et al. | |
| 2009/0212258 A1 | 8/2009 | Mccairn et al. | |
| 2009/0263816 A1 | 10/2009 | Pickett et al. | |
| 2010/0059721 A1 | 3/2010 | Pickett et al. | |
| 2010/0068522 A1 | 3/2010 | Pickett et al. | |
| 2010/0113813 A1 | 5/2010 | Pickett et al. | |
| 2010/0123155 A1 | 5/2010 | Pickett et al. | |
| 2010/0148156 A1* | 6/2010 | Jang et al. | 257/40 |
| 2010/0193767 A1 | 8/2010 | Naasani et al. | |
| 2010/0212544 A1 | 8/2010 | Harris et al. | |
| 2012/0068118 A1* | 3/2012 | Parce et al. | 252/301.36 |

FOREIGN PATENT DOCUMENTS

| | | |
|---|---|---|
| EP | 1176646 | 1/2002 |
| EP | 1783137 | 5/2007 |
| EP | 1854792 | 11/2007 |
| EP | 2028248 A1 | 2/2009 |
| GB | 1995-18910.6 | 11/1995 |
| GB | 2429838 | 3/2007 |
| JP | 2002223008 | 8/2002 |
| JP | 2003286480 | 10/2003 |
| JP | 2005508493 | 3/2005 |
| JP | 2005/139389 | 6/2005 |
| JP | 2007173755 | 7/2007 |
| JP | 2007262215 | 10/2007 |
| KR | 20090020248 | 2/2009 |
| WO | WO-97/10175 | 3/1997 |
| WO | WO-00/17642 | 3/2000 |
| WO | WO-02/04527 | 1/2002 |
| WO | WO-02/24623 | 3/2002 |
| WO | WO-02/29140 | 4/2002 |
| WO | WO-03/099708 | 12/2003 |
| WO | WO-2004/008550 | 1/2004 |
| WO | WO-2004/033366 | 4/2004 |
| WO | WO-2004/065362 | 8/2004 |
| WO | WO-2004/066361 | 8/2004 |
| WO | WO-2005/021150 | 3/2005 |
| WO | WO-2005/106082 | 11/2005 |
| WO | WO-2005/123575 | 12/2005 |
| WO | WO-2006/001848 | 1/2006 |
| WO | WO-2006/017125 | 2/2006 |
| WO | WO-2006/075974 | 7/2006 |
| WO | WO-2006/116337 | 11/2006 |
| WO | WO-2006/118543 | 11/2006 |
| WO | WO-2006/134599 | 12/2006 |
| WO | WO-2007/020416 | 2/2007 |
| WO | WO-2007/049052 | 5/2007 |
| WO | WO-2007/060591 | 5/2007 |
| WO | WO-2007/065039 | 6/2007 |
| WO | WO-2007/098378 | 8/2007 |
| WO | WO-2007/102799 | 9/2007 |
| WO | WO-2008/013780 | 1/2008 |
| WO | WO-2008/054874 | 5/2008 |
| WO | WO-2008/133660 | 11/2008 |
| WO | WO-2009/016354 | 2/2009 |
| WO | WO-2009/040553 | 4/2009 |
| WO | WO-2009/106810 | 9/2009 |

OTHER PUBLICATIONS

Aldana, J. et al. "Photochemical Instability of CdSe Nanocrystals Coated by Hydrophilic Thiols", J. Am. Chem. Soc. (2001), 123: 8844-8850.

Alivisatos, A.P. "Perspectives on the Physical Chemistry of Semiconductor Nanocrystals", J. Phys. Chem., (1996), 100, pp. 13226-13239.

Arici et al., Thin Solid Films 451-452 (2004) 612-618.

Battaglia et al., "Colloidal Two-dimensional Systems: CdSe Quantum Shells and Wells," Angew Chem. (2003) 115:5189.

Bawendi, M.G. The Quantum Mechanics of Larger Semiconductor Clusters ("Quantum Dots"), Annu. Rev. Phys. Chem. (1990), 42: 477-498.

Berry, C.R. "Structure and Optical Absorption of AgI Microcrystals", Phys. Rev. (1967) 161: 848-851.

Bunge, S.D. et al. "Growth and morphology of cadmium chalcogenides: the synthesis of nanorods, tetrapods, and spheres from CdO and $Cd(O_2CCH_3)_2$", J. Mater. Chem. (2003) 13: 1705-1709.

Castro et al., Chem. Mater. (2003) 15:3142-3147.

(56) References Cited

OTHER PUBLICATIONS

Castro et al., "Synthesis and Characterization of Colloidal $CuInS_2$ Nanoparticles from a Molecular Single-Source Precursors," J. Phys. Chem. B (2004) 108:12429.

Chun et al., Thin Solid Films 480-481 (2005) 46-49.

Contreras et al., "ZnO/ZnS(O,OH)/Cu(In,Ga)$Se_2$/Mo Solar Cell with 18:6% Efficiency," from 3d World Conf. on Photovol. Energy Conv., Late News Paper, (2003) pp. 570-573.

Cui et al., "Harvest of near infrared light in PbSe nanocrystal-polymer hybrid photovoltaic cells," Appl. Physics Lett. 88 (2006) 183111-183111-3.

Cumberland et al., "Inorganic Clusters as Single-Source Precursors for Preparation of CdSe, ZnSe, and CdSe/ZnS Nanomaterials" Chemistry of Materials, 14, pp. 1576-1584, (2002).

Dance et al., J. Am. Chem. Soc. (1984) 106:6285.

Daniels et al., "New Zinc and Cadmium Chalcogenide Structured Nanoparticles," Mat. Res. Soc. Symp. Proc. 789 (2004).

Eychmüller, A. et al. "A quantum dot quantum well: CdS/HgS/CdS", Chem. Phys. Lett. 208, pp. 59-62 (1993).

Fendler, J.H. et al. "The Colloid Chemical Approach to Nanostructured Materials", Adv. Mater. (1995) 7: 607-632.

Gao, M. et al. "Synthesis of PbS Nanoparticles in Polymer Matrices", J. Chem. Soc. Commun. (1994) pp. 2779-2780.

Gou et al., J. Am. Chem. Soc. (2006) 128:7222-7229.

Gur et al., "Air stable all-inorganic nanocrystal solar cells processed from solution," Lawrence Berkeley Natl. Lab., Univ. of California, paper LBNL-58424 (2005).

Gurin, Colloids Surf. A (1998) 142:35-40.

Guzelian, A. et al. "Colloidal chemical synthesis and characterization of InAs nanocrystal quantum dots", Appl. Phys. Lett. (1996) 69: 1432-1434.

Guzelian, A. et al., J. Phys. Chem. (1996) 100: 7212.

Hagfeldt, A. et al. "Light-induced Redox Reactions in Nanocrystalline Systems", Chem. Rev. (1995) 95: 49-68.

Henglein, A. "Small-Particle Research: Physicochemical Properties of Extremely Small Colloidal Metal and Semiconductor Particles", Chem Rev. (1989) 89: 1861-1873.

Hirpo et al., "Synthesis of Mixed Copper—Indium Chalcogenolates. Single-Source Precursors for the Photovoltaic Materials $CuInQ_2$ (Q=S, Se)," J. Am. Chem. Soc. (1993) 115:1597.

Hu et al., Sol. State Comm. (2002) 121:493-496.

International Search Report for PCT/GB2005/001611 mailed Sep. 8, 2005 (5 pages).

Jegier, J.A. et al. "Poly(imidogallane): Synthesis of a Crystalline 2-D Network Solid and Its Pyrolysis to Form Nanocrystalline Gallium Nitride in Supercritical Ammonia", Chem. Mater. (1998) 10: 2041-2043.

Jiang et al., Inorg. Chem. (2000) 39:2964-2965.

Kaelin et al., "CIS and CIGS layers from selenized nanoparticle precursors," Thin Solid Films 431-432 (2003) pp. 58-62.

Kapur et al., "Non-Vacuum processing of $CuIn_{1-x}Ga_xSe_2$ solar cells on rigid and flexible substrates using nanoparticle precursor inks," Thin Solid Films 431-432 (2003) pp. 53-57.

Kher, S. et al. "A Straightforward, New Method for the Synthesis of Nanocrystalline GaAs and GaP", Chem. Mater. (1994) 6: 2056-2062.

Kim et al., "Synthesis of CuInGaSe2 Nanoparticles by Low Temperature Colloidal Route," J. Mech. Sci. Tech., Vo. 19, No. 11, pp. 2085-2090 (2005).

Law et al., "Nanowire dye-sensitized solar cells," Nature Mater. (2005) vol. 4 pp. 455-459.

Li et al., Adv. Mat. (1999) 11:1456-1459.

Lieber, C. et al. "Understanding and Manipulating Inorganic Materials with Scanning Probe Microscopes", Angew. Chem. Int. Ed. Engl. (1996) 35: 687-704.

Little et al., "Formation of Quantum-dot quantum-well heteronanostructures with large lattice mismatch: Zn/CdS/ZnS," 114 J. Chem. Phys. 4 (2001).

Lu et al., Inorg. Chem. (2000) 39:1606-1607.

Løver, T. et al. "Preparation of a novel CdS nanocluster material from a thiophenolate-capped CdS cluster by chemical removal of SPh ligands", J. Mater. Chem. (1997) 7(4): 647-651.

Malik et al., Adv. Mat., (1999) 11:1441-1444.

Matijevic, E., "Monodispersed Colloids: Art and Science", Langmuir (1986) 2:12-20.

Matijevic, E. "Production of Mondispersed Colloidal Particles", Ann. Rev. Mater. Sci. (1985) 15: 483-518.

Mekis, I. et al., "One-Pot Synthesis of Highly Luminescent CdSe/CdS Core-Shell Nanocrystals via Organometallic and "Greener" Chemical Approaches", J. Phys. Chem. B. (2003) 107: 7454-7462.

Mews et al., J. Phys. Chem. (1994) 98:934.

Micic et al., "Synthesis and Characterization of InP, GaP, and $GaInP_2$ Quantum Dots", J. Phys. Chem. (1995) pp. 7754-7759.

Milliron et al., "Electroactive Surfactant Designed to Mediate Electron Transfer between CdSe Nanocrystals and Organic Semiconductors," Adv. Materials (2003) 15, No. 1, pp. 58-61.

Murray, C.B. et al., "Synthesis and Characterization of Nearly Monodisperse CdE (E=S, Se, Te) Semiconductor Nanocrystallites", J. Am. Chem. Soc. (1993) 115 (19) pp. 8706-8715.

Nairn et al., Nano Letters (2006) 6:1218-1223.

Nazeeruddin et al., "Conversion of Light to Electricity by cis-X2Bis(2,2'bipyridy1-4,4'- dicarboxylate)ruthenium(II) Charge-Transfer Sensitizers (X=Cl-, Br-, I-, CN-, and SCN-) on Nanocrystalline $TiO_2$ Electrodes," J. Am. Chem. Soc. (1993) 115:6382-6390.

Nazeeruddin et al., "Engineering of Efficient Panchromatic Sensitizers for Nanocrystalline TiO2-Based Solar Cells," J. Am. Chem. Soc. (2001) 123:1613-1624.

O'Brien et al., "The Growth of Indium Selenide Thin Films from a Novel Asymmetric Dialkydiselenocarbamate," 3 Chem. Vap. Depos. 4, pp. 227 (1979).

Olshavsky, M.A., et al. "Organometallic Synthesis of GaAs Crystallites Exhibiting Quantum Confinement", J. Am. Chem. Soc. (1990) 112: 9438-9439.

Olson et al., J. Phys. Chem. C. (2007) 111:16640-16645.

Patents Act 1977: Search Report under Section 17 for Application No. GB0409877.8 dated Oct. 7, 2004 (2 pages).

Patent Act 1977 Search Report under Section 17 for Application No. GB0522027.2 dated Jan. 27, 2006 (1 page).

Patent Act 1977 Search Report under Section 17 for Application No. GB0606845.6 dated Sep. 14, 2006.

Patent Act 1977 Search Report under Section 17 for Application No. GB0719073.9 dated Feb. 29, 2008.

Patent Act 1977 Search Report under Section 17 for Application No. GB0719075.4 dated Jan. 22, 2008.

Patent Act 1977 Search Report under Section 17 for Application No. GB0723539.3 dated Mar. 27, 2008 (1 page).

Peng et al., "Mechanisms of the Shape Evolution of CdSe Nanocrystals", J. Am. Chem. Soc. (2001) 123:1389.

Peng et al., "Kinetics of I-VI and III-V Colloidal Semiconductor Nanocrystal Growth: "Focusing" os Size Distributions", J. Am. Chem. Soc., (1998) 129: 5343-5344.

Peng et al., "Shape control of CdSe nanocrystals", Nature, (2000) vol. 404, No. 6773, pp. 59-61.

Pradhan, N. et al. "Single-Precursor, One-Pot Versatile Synthesis under near Ambient Conditions of Tunable, Single and Dual Band Flouresceng Metal Sulfide Nanoparticles", J. Am. Chem. Soc. (2003) 125: 2050-2051.

Qi et al., "Efficient polymer-nanocrystal quantum-dot photodetectors," Appl. Physics Lett. 86 (2005) 093103-093103-3.

Qu, L. et al. "Alternative Routes toward High Quality CdSe Nanocrystals", Nano Lett. (2001) vol. 1, No. 6, pp. 333-337.

Robel et al., "Quantum Dot Solar Cells. Harvesting Light Energy with CdSe Nanocrystals Molecularly Linked to Mesoscopic $TiO_2$ Films," J. Am. Chem. Soc. (2006) 128: 2385-2393.

Salata, O.V. et al. "Uniform GaAs quantum dots in a polymer matrix", Appl. Phys. Letters (1994) 65(2): 189-191.

Sercel, P.C. et al. "Nanometer-scale GaAs clusters from organometallic percursors", Appl. Phys. Letters (1992) 61: 696-698.

Shulz et al., J. Elect. Mat. (1998) 27:433-437.

Steigerwald, M.L. et al. "Semiconductor Crystallites: A Class of Large Molecules", Acc. Chem. Res. (1990) 23: 183-188.

(56) References Cited

OTHER PUBLICATIONS

Stroscio, J.A. et al. "Atomic and Molecular Manipulation with the Scanning Tunneling Microscope", Science (1991), 254: 1319-1326.
Trinidade et al., "A Single Source Spproach to the Synthesis of CdSe Nanocrystallites", Advanced Materials, (1996) vol. 8, No. 2, pp. 161-163.
Vayssieres et al., "Highly Ordered $SnO_2$ Nanorod Arrays from Controlled Aqueous Growth," Angew. Chem. Int. Ed. (2004) 43: 3666-3670.
Wang Y. et al. "PbS in polymers, From molecules to bulk solids", J. Chem. Phys. (1987) 87: 7315-7322.
Weller, H. "Colloidal Semiconductor Q-Particles: Chemistry in the Transition Region Between Solid State and Molecules", Angew. Chem. Int. Ed. Engl. (1993) 32: 41-53.
Weller, H. "Quantized Semiconductor Particles: A Novel State of Mater for Materials Science", Adv. Mater. (1993) 5: 88-95.
Wells, R.L. et al. "Synthesis of Nanocrystalline Indium Arsenide and Indium Phosphide from Indium(III) Halides and Tris (trimethylsilyl)pnicogens. Synthesis, Characterization, and Decomposition Behavior of $I_3In$—$P(SiMe_3)_3$", Chem. Mater. (1995) 7: 793-800.
Xiao et al., J. Mater. Chem. (2001) 11:1417-1420.
Yang et al., Crystal Growth & Design (2007) 12:2562-2567.
Yu et al., "Polymer Photovoltaic Cells: Enhanced Efficiencies via a Network of Internal Donor-Acceptor Heterojunctions," 270 Science 5243 (1995), pp. 1789-1791.
Zhong et al., Nanotechnology 18 (2007) 025602.
Barron, "Group III Materials: New Phases and Nono-particles with Applications in Electronics and Optoelectronics," Office of Naval Research Final Report (1999).
Dabousi et al., "(CdSe)ZnS Core—Shell Quantum Dots: Synthesis and Characterization of a Size Series of Highly Luminescent Nanocrystallites," Jrl. Phys. Chem.,(1997) 101, pp. 9463-9475.
Dehnen et al., "Chalcogen-Bridged Copper Clusters," Eur. J. Inorg. Chem., (2002) pp. 279-317.
Eisenmann et al., "New Phosphido-bridged Multinuclear Complexes of Ag and Zn," Zeitschrift fur anorganische und allgemeine Chemi (1995). (1 page—abstract).
Müller et al., "From Giant Molecular Clusters and Precursors to Solid-state Structures," Current Opinion in Solid State and Materials Science, 4 (Apr. 1999) pp. 141-153.
Timoshkin, "Group 13 imido metallanes and their heavier analogs [RMYR']n (M=Al, Ga, In; Y=N, P, As, Sb)," Coordination Chemistry Reviews (2005).
Vittal, "The chemistry of inorganic and organometallic compounds with adameantane-like structures," Polyhedron, vol. 15, No. 10, pp. 1585-1642 (1996).
Zhong et al, "Composition-Tunable ZnxCu1-xSe Nanocrytals with High Luminescence and Stability", Jrl Amer. Chem. Soc. (2003).
International Search Report and Written Opinion for PCT/GB2006/003028 mailed Jan. 22, 2007 (15 pages).
Nielsch et al., "Uniform Nickel Deposition into Ordered Alumina Pores by Pulsed Electrodeposition", Advanced Materials, 2000 vol. 12, No. 8, pp. 582-586.
Huang et al., "Bio-Inspired Fabrication of Antireflection Nanostructures by Replicating Fly Eyes", Nanotechnology (2008) vol. 19.
Materials Research Society Symposium Proceedings Quantum Dots, Nanoparticles and Nanowires, 2004, ISSN: 0272-9172.
Xie et. al., "Synthesis and Characterization of Highly Luminescent CdSe-Core CdS/Zn0.5Cd0.5S/ZnS Multishell Nanocrystals," JACS Articles published on web Apr. 29, 2005.
Kim et. al., "Engineering InAsxP1-x/InP/ZnSe III-V Alloyed Core-Shell Quantum Dots for the Near-Infrared," JACS Articles published on web Jul. 8, 2005.
Rao et. al. "The Chemistry of Nanomaterials: Synthesis, Properties and Applications" (2004).
Trinidade et al., "Nanocrystalline Seminconductors: Synthesis, Properties, and Perspectives", Chemistry of Materials, (2001) vol. 13, No. 11, pp. 3843-3858.

International Search Report for PCT/GB2009/001928 mailed Dec. 8, 2009 (3 pages).
International Search Report for PCT/GB2009/002605 mailed Feb. 22, 2010 (3 pages).
Search Report for GB0813273.0 searched Dec. 8, 2008 (1 page).
Search Report for GB0814458.6 searched Dec. 5, 2008 (2 pages).
Search Report for GB0820101.4 searched Mar. 3, 2009 (1 page).
Search Report for GB0821122.9 searched Mar. 19, 2009 (2 pages).
Foneberov et al., "Photoluminescence of tetrahedral quantum-dot quantum wells" Physica E, 26:63-66 (2005).
Cao, "Effect of Layer Thickness on the Luminescence Properties of ZnS/CdS/ZnS quantum dot quantum well", J. of Colloid and Interface Science 284:516-520 (2005).
Harrison et al. "Wet Chemical Synthesis on Spectroscopic Study of CdHgTe Nanocrystals with Strong Near-Infrared Luminescence" Mat. Sci and Eng.B69-70:355-360 (2000).
Sheng et al. "In-Situ Encapsulation of Quantum Dots into Polymer Microsphers", Langmuir 22(8):3782-3790 (2006).
W. Peter Wuelfing et al., "Supporting Information for Nanometer Gold Clusters Protected by Surface Bound Monolayers of Thiolated Poly (ethylene glycol) Polymer Electrolyte" Journal of the American Chemical Society (XP002529160) (1998).
International Search Report for PCT/GB2009/000510 mailed Jul. 6, 2010 (16 pages).
International Search Report for PCT/GB2008/003958 mailed Sep. 4, 2009 (4 pages).
Banger et al., "Ternary single-source precursors for polycrystalline thin-film solar cells" Applied Organometallic Chemistry, 16:617-627, XP002525473 Scheme 1 Chemical Synthesis (2002).
D Qi, M Fischbein, M Drndic, S. Selmic, "Efficient polymer-nanocrystal quantum-dot photodetectors", Appl. Phys. Lett., 2004, 84, 4295.
Shen et al., "Photoacoustic and photoelectrochemical characterization of CdSe-sensitized Ti02 electrodes composed of nanotubes and nanowires" Thin Solid Films, Elsevier-Sequoia S.A. Lausanne, CH vol. 499, No. 1-2, (Mar. 21, 2006), pp. 299-305, XP005272241 ISSN: 0040-6090.
Smestad GP, et al., "A technique to compare polythiophene solid-state dye sensitized Ti02 solar cells to liquid junction devices" Solar Energy Materials and Solar Cells, Elsevier Science Publishers, Amsterdam, NL, vol. 76, No. 1, Feb. 15, 2003, pp. 85-105, XP004400821 ISSN: 0927-0248.
Chen et al., "Electrochemically synthesized CdS nanoparticle-modified Ti02 nanotube-array photoelectrodes: Preparation, characterization, and application to photoelectrochemical cells" Journal of Photochemistry and Photobiology, a: Chemistry, Elsevier Sequoia Lausanne, CH, vol. 177, No. 2-3, Jan. 25, 2006, pp. 177-184, XP005239590 ISSN: 1010-6030.
Wang, et al., "In situ polymerization of amphiphilic diacetylene for hole transport in solid state dye-sensitized solar cells" Organic Electronics, El Sevier, Amsterdam NL, vol. 7, No. 6, Nov. 18, 2006, pp. 546-550, XP005773063 ISSN: 1566-1199.
International Search Report and Written Opinion for PCT/GB2008/001457 mailed Aug. 21, 2008 (14 pages).
Richardson et al., "Chemical Engineering: Chemical and Biochemical Reactors and Process Control," vol. 3, Third Edition pp. 3-5 (1994).
Borchert et al., "High Resolution Photoemission STudy of CdSe and CdSe/ZnS Core-Shell Nanocrystals," Journal of Chemical Physics, vol. 119, No. 3, pp. 1800-1807 (2003).
Gaponik et al., "Thiol-Capping of CdTe Nanocrystals: An Alternative to Organometallic Synthetic Routes," Journal of Physical Chemistry B, vol. 106, No. 29, pp. 7177-7185 (2002).
Pickett et al., "Syntheses of Semiconductor Nanoparticles Using Single-Molecular Precursors," The Chemical Record, vol. 1 pp. 467-479 (2001).
Hu et al., Solar Cells: From basics to advanced systems. McGraw-Hill Book Co. pp. 73-74 (1983).
Talapin et al. "Synthesis of Surface-Modified Colloidal Semiconductor Nanocrystals and Study of Photoinduced Charge Separation and Transport in Nanocrystal-Polymer Composites," Physica E, vol. 14, pp. 237-241 (2002).

* cited by examiner

SEMICONDUCTOR NANOPARTICLE-BASED MATERIALS

RELATED APPLICATIONS

This application claims the benefit of and priority to copending application GB 0916699.2 filed Sep. 23, 2009 and U.S. Provisional Patent Application Ser. No. 61/246,287 filed Sep. 28, 2009, the disclosures of which are incorporated herein by reference in their entireties.

FIELD OF THE INVENTION

In various embodiments, the present invention relates to semiconductor nanoparticle-based materials, particularly, but not exclusively, quantum dot-containing beads for use in the fabrication of quantum dot-based light-emitting devices.

There has been substantial interest in exploiting the properties of compound semiconductors consisting of particles with dimensions in the order of 2-50 nm, often referred to as quantum dots (QDs) or nanocrystals. These materials are of commercial interest due to their size-tuneable electronic properties which can be exploited in many commercial applications such as optical and electronic devices and other applications that range from biological labelling, photovoltaics, catalysis, biological imaging, LEDs, general space lighting and electroluminescent displays amongst many new and emerging applications.

The most studied of semiconductor materials have been the chalcogenides II-VI materials namely ZnS, ZnSe, CdS, CdSe, CdTe; most noticeably CdSe due to its tuneability over the visible region of the spectrum. Reproducible methods for the large scale production of these materials have been developed from "bottom up" techniques, whereby particles are prepared atom-by-atom, i.e., from molecules to clusters to particles, using "wet" chemical procedures.

Two fundamental factors, both related to the size of the individual semiconductor nanoparticle, are responsible for their unique properties. The first is the large surface to volume ratio; as a particle becomes smaller, the ratio of the number of surface atoms to those in the interior increases. This leads to the surface properties playing an important role in the overall properties of the material. The second factor being, with many materials including semiconductor nanoparticles, that there is a change in the electronic properties of the material with size; moreover, because of quantum confinement effects the band gap gradually becomes larger as the size of the particle decreases. This effect is a consequence of the confinement of an 'electron in a box' giving rise to discrete energy levels similar to those observed in atoms and molecules, rather than a continuous band as observed in the corresponding bulk semiconductor material. Thus, for a semiconductor nanoparticle, because of the physical parameters, the electron and hole, produced by the absorption of electromagnetic radiation (a photon, with energy greater than the first excitonic transition), are closer together than they would be in the corresponding macrocrystalline material, moreover the Coulombic interaction cannot be neglected. This leads to a narrow bandwidth emission, which is dependent upon the particle size and composition of the nanoparticle material. Thus, quantum dots have higher kinetic energy than the corresponding macrocrystalline material and consequently the first excitonic transition (band gap) increases in energy with decreasing particle diameter.

Core semiconductor nanoparticles, which consist of a single semiconductor material along with an outer organic passivating layer, tend to have relatively low quantum efficiencies due to electron-hole recombination occurring at defects and dangling bonds situated on the nanoparticle surface which can lead to non-radiative electron-hole recombinations. One method to eliminate defects and dangling bonds on the inorganic surface of the quantum dot is to grow a second inorganic material, having a wider band-gap and small lattice mismatch to that of the core material epitaxially on the surface of the core particle, to produce a "core-shell" particle. Core-shell particles separate any carriers confined in the core from surface states that would otherwise act as non-radiative recombination centres. One example is a ZnS shell grown on the surface of a CdSe core. Another approach is to prepare a core-multi shell structure where the electron-hole pair is completely confined to a single shell layer consisting of a few monolayers of a specific material such as a quantum dot-quantum well structure. Here, the core is of a wide band gap material, followed by a thin shell of narrower band gap material, and capped with a further wide band gap layer, such as CdS/HgS/CdS grown using substitution of Hg for Cd on the surface of the core nanocrystal to deposit just a few monolayers of HgS which is then over grown by a monolayer of CdS. The resulting structures exhibit clear confinement of photo-excited carriers in the HgS layer. To add further stability to quantum dots and help to confine the electron-hole pair one of the most common approaches is by epitaxially growing a compositionally graded alloy layer on the core; this can help to alleviate strain that could otherwise led to defects. Moreover for a CdSe core, in order to improve structural stability and quantum yield, rather growing a shell of ZnS directly on the core a graded alloy layer of $Cd_{1-x}Zn_xSe_{1-y}S_y$ can be used. This has been found to greatly enhance the photoluminescence emission of the quantum dots.

Doping quantum dots with atomic impurities is an efficient way also of manipulating the emission and absorption properties of the nanoparticle. Procedures for doping of wide band gap materials, such as zinc selenide and zinc sulfide, with manganese and copper (ZnSe:Mn or ZnS:Cu), have been developed. Doping with different luminescence activators in a semiconducting nanocrystal can tune the photoluminescence and electroluminescence at energies even lower than the band gap of the bulk material whereas the quantum size effect can tune the excitation energy with the size of the quantum dots without having a significant change in the energy of the activator-related emission.

The widespread exploitation of quantum dot nanoparticles has been restricted by their physical/chemical instability and incompatibility with many of the materials and/or processes required to exploit the quantum dots to their full potential, such as incorporation into solvents, inks, polymers, glasses, metals, electronic materials, electronic devices, bio-molecules and cells. Consequently, a series of quantum dot surface modification procedures has been employed to render the quantum dots more stable and compatible with the materials and/or processing requirements of a desired application.

A particularly attractive potential field of application for quantum dots is in the development of next generation light-emitting diodes (LEDs). LEDs are becoming increasingly important in modern-day life and it is envisaged that they have the potential to become one of the major applications for quantum dots, in for example, automobile lighting, traffic signals, general lighting, liquid crystal display (LCD) back-lighting and display screens.

Currently, LED devices are made from inorganic solid-state compound semiconductors, such as AlGaAs (red), AlGaInP (orange-yellow-green), and AlGaInN (green-blue); however, using a mixture of the available solid-state compound semiconductors, solid-state LEDs which emit white light cannot be produced. Moreover, it is difficult to produce "pure" colours by mixing solid-state LEDs of different frequencies. Therefore, currently the main method of colour mixing to produce a required colour, including white, is to use a combination of phosphorescent materials which are placed on top of the solid-state LED whereby the light from the LED (the "primary light") is absorbed by the phosphorescent material and then re-emitted at a different frequency (the "secondary light"), i.e., the phosphorescent materials down-convert the primary light to the secondary light. Moreover, the use of white LEDs produced by phosphor down-conversion leads to lower cost and simpler device fabrication than a combination of solid-state red-green-blue LEDs.

Current phosphorescent materials used in down-converting applications absorb UV or mainly blue light and convert it to longer wavelengths, with most phosphors currently using trivalent rare-earth doped oxides or halophosphates. White emission can be obtained by blending phosphors which emit in the blue, green and red regions with that of a blue or UV-emitting solid-state device. i.e., a blue-light-emitting LED plus a green phosphor such as, $SrGa_2S_4:Eu_2^+$, and a red phosphor such as, $SrSiEu_2^+$ or a UV-light-emitting LED plus a yellow phosphor such as, $Sr_2P_2O_7:Eu_2^+$; $Mu_2^+$, and a blue-green phosphor. White LEDs can also be made by combining a blue LED with a yellow phosphor, however, colour control and colour rendering is poor when using this methodology due to lack of tunability of the LEDs and the phosphor. Moreover, conventional LED phosphor technology uses down-converting materials that have poor colour rendering (i.e., colour rendering index (CRI)<75).

Rudimentary quantum dot-based light-emitting devices have been made by embedding colloidally produced quantum dots in an optically clear (or sufficiently transparent) LED encapsulation medium, typically a silicone or an acrylate, which is then placed on top of a solid-state LED. The use of quantum dots potentially has some significant advantages over the use of the more conventional phosphors, such as the ability to tune the emission wavelength, strong absorption properties and low scattering if the quantum dots are mono-dispersed.

For the commercial application of quantum dots in next-generation light-emitting devices, the quantum dots may be incorporated into the LED encapsulating material while remaining as fully mono-dispersed as possible and without significant loss of quantum efficiency. The methods developed to date are problematic, not least because of the nature of current LED encapsulants. Quantum dots can agglomerate when formulated into current LED encapsulants, thereby reducing the optical performance of the quantum dots. Moreover, even after the quantum dots have been incorporated into the LED encapsulant, oxygen can still migrate through the encapsulant to the surfaces of the quantum dots, which can lead to photo-oxidation and, as a result, a drop in quantum yield (QY).

In view of the significant potential for the application of quantum dots across such a wide range of applications, including but not limited to, quantum dot-based light-emitting devices, work has already been undertaken by various groups to try to develop methods to increase the stability of quantum dots so as to make them brighter, more long-lived and/or less sensitive to various types of processing conditions. For example, reasonably efficient quantum dot-based light-emitting devices can be fabricated under laboratory conditions building on current published methods; however, there remain significant challenges to the development of quantum dot-based materials and methods for fabricating quantum dot-based devices, such as light-emitting devices, on an economically viable scale and which would provide sufficiently high levels of performance to satisfy consumer demand.

SUMMARY

Various embodiments of the present invention obviate or mitigate one or more of the above problems with semiconductor nanoparticle-based materials and/or current methods for fabricating such materials.

A first aspect of embodiments of the present invention provides a primary particle including a primary matrix material containing a population of semiconductor nanoparticles, wherein each primary particle further includes an additive to enhance the physical, chemical and/or photo-stability of the semiconductor nanoparticles.

Embodiments of the current invention thus provide a means by which the robustness, and consequently, the performance of semiconductor nanoparticles may be improved for use in a wide range of applications, particularly, but not exclusively the fabrication of semiconductor nanoparticle-based light-emitting devices, preferably where the device incorporates an LED as a primary light source and the semiconductor nanoparticles as a secondary light source. By providing each primary particle with one or more stability enhancing additives, the semiconductor nanoparticles are less sensitive to their surrounding environment and subsequent processing steps.

In a preferred embodiment, a plurality of quantum dots are incorporated into one or more silica beads which also include a free-radial scavenger, such as benzophenone or a derivative thereof, which quantum dot-containing beads are then embedded or entrapped within a host LED encapsulation material such as a silicone, an epoxy resin, a (meth)acrylate or a polymeric material. Such an arrangement is depicted schematically in FIG. 1, wherein an LED 1, which is arranged to emit blue primary light 2 upon the application of current, is submerged in a commercially available LED encapsulant 3 in which is embedded a plurality of quantum dot-containing silica beads 4, 5 also incorporating a free-radical scavenger to enhance the stability of the beads; some of the beads 4 contain quantum dots that emit red secondary light 6 upon excitation by the blue primary light from the LED 1, and the remaining beads 4 contain quantum dots which emit green secondary light 7 upon excitation by the blue primary light from the LED 1.

The term "bead" is used herein for convenience and is not intended to impose any particular size or shape limitation to the material described as a "bead". Thus, for example, the beads may be spherical but other configurations are possible. Where reference is made herein to "microbeads" this is intended to refer to "beads" as defined above having a dimension on the micron scale.

The or each primary particle may be provided with a separate layer of a surface coating material. The term "coating" is used herein to refer to one or more layers of material provided on another material, which may partially or fully cover the exterior surface or solvent accessible surface of that other material. The material of the "coating" may penetrate at least partially into the internal structure of the material to which it has been applied, provided the coating still affords a level of protection or functions in some way as a barrier to the passage of potentially harmful species, e.g., oxygen, through the coated material. It will be appreciated from the wording used to define the various aspects of the present invention herein that the coating applied to each primary particle results in the production of a plurality of separate, distinct coated particles rather than a plurality of particles contained or encapsulated within the same, unitary matrix-type material, such as a plurality of resin beads dispersed throughout an LED encapsulant.

The nanoparticle-containing primary particles or beads are preferably provided in the form of microbeads. By pre-loading small microbeads, which may range in size from 50 nm to 500 µm or more preferably 25 nm to 0.1 mm or more preferably still 20 nm to 0.5 mm in diameter, with quantum dots, adding an additive, and then optionally providing a surface coating of, for example, a polymer or oxide material, the resulting beads are more stable towards their surrounding environment and/or subsequent processing conditions, such as the incorporation of the quantum dot-containing beads into an LED encapsulation material on a UV or blue LED. As a result, not only does handling of the quantum dots become easier, but their optical performance may be improved and it may become simpler to tune the colour of the light they emit, for example when used in an LED-based device. Moreover, this approach is simpler than attempting to incorporate quantum dots directly into an LED encapsulate (for example, a silicone, an epoxy, a (meth)acrylate, a polymeric material or the like) in terms of ease of colour rendering, processing, and reproducibility and offers greater quantum dot stability to photo-oxidation.

The quantum dot-containing beads may be made to any desirable size, such as the same size as currently employed YAG phosphor materials which range from 10 to 100 µm and may thus be supplied to existing LED manufacturers in a similar form to that of the current commercially used phosphor materials. Moreover, the quantum dot-containing beads incorporating the additive(s) is (are) in a form that is compatible with the existing LED fabrication infrastructure.

With the advantage of very little or no loss of quantum dot quantum yield (QY) in processing; this new approach of optionally coated quantum dot-containing beads incorporating stability-enhancing additives leads to less loss of quantum efficiency than when formulating the quantum dots directly into a LED encapsulation medium or when using quantum dot beads not incorporating such additives or a protective surface coating. Because there is very little or no loss of quantum yield it is easier to colour render and less binning may be needed. It has been shown that when formulating quantum dots directly into an encapsulation medium using prior art methods, colour control is very difficult due to quantum dot re-absorption or loss of quantum yield and shifting of the PL max position. Moreover batch to batch, i.e., device-to-device, reproducibility is very difficult or impossible to achieve. By pre-loading the quantum dots into one or more beads also incorporating the stability-enhancing additive(s), and then optionally coating the beads, the colour of the light emitted by the device is of higher quality, easier to control and is more reproducible.

By incorporating known amounts of quantum dots into beads also incorporating stability-enhancing additives, and optionally providing the beads with a protective surface coating, migration of deleterious species, such as moisture, oxygen and/or free radicals, is eliminated or at least reduced, thereby eliminating or at least minimising these common hurdles to the industrial production of quantum dot based materials and devices.

A second aspect of some embodiments of the present invention provides a method for preparing a primary particle including a primary matrix material, a population of semiconductor nanoparticles and an additive to enhance the physical, chemical and/or photo-stability of the semiconductor nanoparticles, the method including combining the semiconductor nanoparticles, primary matrix material and additive under conditions suitable to produce the primary particle.

An additive may be combined with "naked" semiconductor nanoparticles and precursors to the primary matrix material during initial production of the primary particles. Alternatively, or additionally, an additive may be added after the semiconductor nanoparticles have been entrapped within the primary matrix material.

The quantum-dot containing primary particles incorporating an additive may be dispersed in a secondary matrix material, which may be the same or different to the primary matrix material.

A further aspect of embodiments of the present invention provides a composite material incorporating a plurality of primary particles according to the first aspect of the present invention dispersed within a secondary matrix material.

A still further aspect provides a light-emitting device including a primary light source in optical communication with a formulation including a composite material according to the above further aspect embedded in a host light-emitting diode encapsulation medium.

The secondary matrix material may be selected from the group of primary matrix materials set out above. By way of example, the secondary matrix material may include a material selected from the group consisting of a polymer, a resin, a monolith, a glass, a sol gel, an epoxy, a silicone and a (meth)acrylate.

Additionally, the secondary matrix material may be formed into one or more secondary particles containing one or more primary particles. The secondary particles may be provided with a further additive in a similar manner to that described herein in respect of additives added to the primary particles. Accordingly, the secondary matrix material may be in the form of one or more secondary particles and the or each secondary particle may be provided with a further stability-enhancing additive, which may be the same or different to the one or more additives present in the primary particles.

Alternatively, the quantum dots may first be captured within one or more types of matrix material, such as one or more types of polymeric bead, and then each of those beads, or beads within beads, may be contained within a primary matrix material to form the primary particles of the first and second aspects of the present invention, which incorporate a stability-enhancing additive. Thus, the semiconductor nanoparticles contained within the primary matrix material may be "naked" nanoparticles, or may already be contained within one or more layers of matrix material before being captured within the primary matrix material and coated.

FIGS. 7 to 10 depict processes according to four preferred embodiments of the present invention in which additives are added at different stages during the formation of quantum dot-containing beads, or quantum dot-containing beads within one or more types of larger bead.

FIG. 7 illustrates a process according to a first embodiment of the present invention wherein an additive is combined with a population of "naked" quantum dots during formation of a primary particle containing the quantum dots and, consequently, the additive. FIG. 8 illustrates a process according to a second embodiment wherein "naked" quantum dots are first encapsulated within a bead formed of a first type of polymer (polymer 1) and then an additive is combined with the quantum dot-containing bead during formation of a primary particle made from a second type of polymer (polymer 2) containing the quantum dot-containing bead and, consequently, the additive. FIG. 9 depicts a process according to a third embodiment wherein quantum dots are first encapsulated within a population of beads formed of a first type of polymer (polymer 1) and then an additive is combined with the quantum dot-containing beads during formation of a primary particle made from a second type of polymer (polymer 2) containing the quantum dot-containing beads and, consequently, the additive. FIG. 10 illustrates a process according to a fourth embodiment wherein quantum dots are first encapsulated within a population of beads formed of a first type of polymer (polymer 1), which are then encapsulated within a bead formed of a second type of polymer (polymer 2) to form a "bead-in-bead" composite material, and then an additive is combined with the quantum dot-containing bead-in-bead composite material during formation of a primary particle made from a third type of polymer (polymer 3) containing the quantum dot-containing "bead-in-bead" composite material and, consequently, the additive. It will be appreciated that any of the above embodiments may be combined such that additives could be added at more than one stage during primary particle formation, resulting in primary particles containing bead-in-bead composites with the same or different additives in two or more layers or shells of the primary particles.

A further aspect of embodiments of the present invention provides a light-emitting device including a primary light source in optical communication with a formulation including a plurality of primary particles according to the first aspect of the present invention embedded in a host light-emitting diode encapsulation medium.

BRIEF DESCRIPTION OF FIGURES

Embodiments of the present invention are illustrated with reference to the following non-limiting examples and figures in which.

DETAILED DESCRIPTION

Primary Matrix Material

Figure 1:
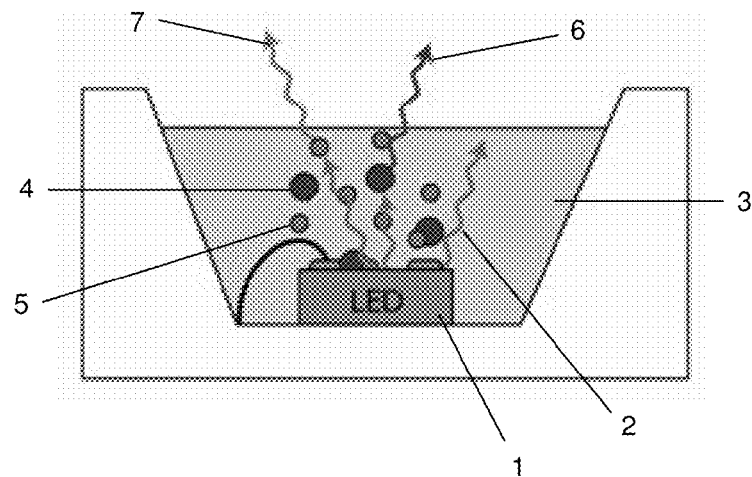
FIG. 1 schematically depicts a quantum dot-based light-emitting device according to an aspect of embodiments of the present invention.

The primary matrix material is preferably an optically transparent medium, i.e., a medium through which light may pass, and which may be, but does not have to be substantially optically clear. The primary matrix material, preferably in the form of a bead or microbead, may be a resin, polymer, monolith, glass, sol gel, epoxy, silicone, (meth)acrylate or the like, or may include silica.

Examples of preferred primary matrix materials include acrylate polymers (e.g., polymethyl(meth)acrylate, polybutylmethacrylate, polyoctylmethacrylate, alkylcyanoacryaltes, polyethyleneglycol dimethacrylate, polyvinylacetate etc), epoxides (e.g., EPOTEK 301 A+B Thermal curing epoxy, EPOTEK OG112-4 single pot UV curing epoxy, or EX0135A and B Thermal curing epoxy), polyamides, polyimides, polyesters, polycarbonates, polythioethers, polyacrylonitryls, polydienes, polystyrene polybutadiene copolymers (Kratons), pyrelenes, poly-para-xylylene (parylenes), silica, silica-acrylate hybrids, polyetheretherketone (PEEK), polyvinylidene fluoride (PVDF), polydivinyl benzene, polyethylene, polypropylene, polyethylene terephthalate (PET), polyisobutylene (butyl rubber), polyisoprene, and cellulose derivatives (methyl cellulose, ethyl cellulose, hydroxypropylmethyl cellulose, hydroxypropylmethylcellulose phthalate, nitrocellulose), and combinations thereof.

Stability-Enhancing Additives

The additives which may be added singly or in any desirable combination to the primary particles containing the semiconductor nanoparticles may be grouped according to their intended function as follows:
  a. Mechanical sealing: Fumed silica (e.g., Cab-O-Sil™), ZnO, $TiO_2$, ZrO, Mg stearate, Zn Stearate, all used as a filler to provide mechanical sealing and/or reduce porosity;
  b. Capping agents: Tetradecyl phosphonic acid (TDPA), oleic acid, stearic acid, polyunsaturated fatty acids, sorbic acid. Zn methacrylate, Mg stearate, Zn Stearate, isopropyl myristate. Some of these have multiple functionality and may act as capping agents, free radical scavengers and/or reducing agents;
  c. Reducing agents: Ascorbic acid palmitate, alpha tocopherol (vitamin E), octane thiol, butylated hydroxyanisole (BHA), butylated hydroxytoluene (BHT), gallate esters (propyl, lauryl, octyl and the like), and a metabisulfite (e.g., the sodium or potassium salt);
  d. Free radical scavengers: benzophenones; and
  e. Hydride reactive agents: 1,4-butandiol, 2-hydroxyethyl methacrylate, allyl methacrylate, 1,6 heptadiene-4-ol, 1,7 octadiene, and 1,4 butadiene.

The selection of the additive or additives for a particular application depends upon the nature of the semiconductor nanoparticle material (e.g., how sensitive the nanoparticle material is to physical, chemical and/or photo-induced degradation), the nature of the primary matrix material (e.g., how porous it is to potentially deleterious species, such as free-radicals, oxygen, moisture etc), the intended function of the final material or device which will contain the primary particles (e.g., the operating conditions of the material or device), and the process conditions for fabricating the final material or device. Thus, with prior knowledge of the above risk-factors, one or more appropriate additives may be selected from the above five lists to suit any desirable semiconductor nanoparticle application.

Primary Particle Surface Coating Materials

One of the intended functions of the coating which may be provided on the primary particles is to provide each primary particle with a protective barrier to prevent the passage or diffusion of potentially deleterious species, e.g., oxygen, moisture or free radicals, from the external environment through the primary matrix material to the semiconductor nanoparticles. As a result, the semiconductor nanoparticles are less sensitive to their surrounding environment and the various processing conditions typically required to utilise the nanoparticles in applications such as the fabrication of LED-based light-emitting devices.

The coating is preferably a barrier to the passage of oxygen or any type of oxidising agent through the primary matrix material. The coating may be a barrier to the passage of free radical species through the primary matrix material, and/or is preferably a moisture barrier so that moisture in the environment surrounding the primary particles cannot contact the semiconductor nanoparticles within the primary particles.

The coating may provide a layer of coating material on a surface of the primary particle of any desirable thickness provided it affords the preferred level of protection. The surface layer coating may be around 1 to 10 nm thick, up to around 400 to 500 nm thick, or more. Preferred layer thicknesses are in the range 1 nm to 200 nm, more preferably around 5 to 100 nm.

In a first preferred embodiment, the coating includes an inorganic material, such as a dielectric (insulator), a metal oxide, a metal nitride or a silica-based material (e.g., a glass).

The metal oxide may be a single metal oxide (i.e., oxide ions combined with a single type of metal ion, e.g., $Al_2O_3$), or may be a mixed metal oxide (i.e., oxide ions combined with two or more types of metal ion, e.g., $SrTiO_3$). The metal ion(s) of the (mixed) metal oxide may be selected from any suitable group of the periodic table, such as group 2, 13, 14 or 15, or may be a transition metal, d-block metal, or lanthanide metal.

Preferred metal oxides are selected from the group consisting of $Al_2O_3$, $B_2O_3$, $CO_2O_3$, $Cr_2O_3$, $CuO$, $Fe_2O_3$, $Ga_2O_3$, $HfO_2$, $In_2O_3$, $MgO$, $Nb_2O_5$, $NiO$, $SiO_2$, $SnO_2$, $Ta_2O_5$, $TiO_2$, $ZrO_2$, $Sc_2O_3$, $Y_2O_3$, $GeO_2$, $La_2O_3$, $CeO_2$, $PrO_x$ (x=appropriate integer), $Nd_2O_3$, $Sm_2O_3$, $EuO_y$ (y=appropriate integer), $Gd_2O_3$, $Dy_2O_3$, $Ho_2O_3$, $Er_2O_3$, $Tm_2O_3$, $Yb_2O_3$, $Lu_2O_3$, $SrTiO_3$, $BaTiO_3$, $PbTiO_3$, $PbZrO_3$, $Bi_mTi_nO$ (m=appropriate integer; n=appropriate integer), $Bi_aSi_bO$ (a=appropriate integer; b=appropriate integer), $SrTa_2O_6$, $SrBi_2Ta_2O_9$, $YScO_3$, $LaAlO_3$, $NdAlO_3$, $GdScO_3$, $LaScO_3$, $LaLuO_3$, $Er_3Ga_5O_{13}$.

Preferred metal nitrides may be selected from the group consisting of $BN$, $AlN$, $GaN$, $InN$, $Zr_3N_4$, $Cu_2N$, $Hf_3N_4$, $SiN_c$ (c=appropriate integer), $TiN$, $Ta_3N_5$, $Ti$—$Si$—$N$, $Ti$—$Al$—$N$, $TaN$, $NbN$, $MoN$, $WN_d$ (d=appropriate integer), and $WN_eC_f$ (e=appropriate integer; f=appropriate integer).

The inorganic coating may include silica in any appropriate crystalline form.

The coating may incorporate an inorganic material in combination with an organic or polymeric material. By way of example, in a preferred embodiment, the coating is an inorganic/polymer hybrid, such as a silica-acrylate hybrid material.

In a second preferred embodiment, the coating includes a polymeric material, which may be a saturated or unsaturated hydrocarbon polymer, or may incorporate one or more heteroatoms (e.g., O, S, N, halo) or heteroatom-containing functional groups (e.g., carbonyl, cyano, ether, epoxide, amide and the like).

Examples of preferred polymeric coating materials include acrylate polymers (e.g., polymethyl(meth)acrylate, polybutylmethacrylate, polyoctylmethacrylate, alkylcyanoacryaltes, polyethyleneglycol dimethacrylate, polyvinylacetate etc), epoxides (e.g., EPOTEK 301 A+B Thermal curing epoxy, EPOTEK OG112-4 single pot UV curing epoxy, or EX0135A and B Thermal curing epoxy), polyamides, polyimides, polyesters, polycarbonates, polythioethers, polyacrylonitryls, polydienes, polystyrene polybutadiene copolymers (Kratons), pyrelenes, poly-para-xylylene (parylenes), polyetheretherketone (PEEK), polyvinylidene fluoride (PVDF), polydivinyl benzene, polyethylene, polypropylene, polyethylene terephthalate (PET), polyisobutylene (butyl rubber), polyisoprene, and cellulose derivatives (methyl cellulose, ethyl cellulose, hydroxypropylmethyl cellulose, hydroxypropylmethylcellulose phthalate, nitrocellulose), and combinations thereof.

By incorporating quantum dots into primary particle materials of the kind described above and coating the particles, he otherwise reactive quantum dots may be protected from the potentially damaging surrounding chemical environment. Moreover, by placing a number of quantum dots into a single bead, for example in the size range from 20 nm to 500 μm in diameter, and providing the bead with a suitable protective coating of, for example, a polymeric or inorganic material, the resulting coated QD-bead is more stable than either free "naked" quantum dots, or uncoated QD-beads to the types of chemical, mechanical, thermal and/or photo-processing steps which are required to incorporate quantum dots in most commercial applications, such as when employing quantum dots as down-converters in a QD-solid-state-LED light-emitting device.

Each primary particle may contain any desirable number and/or type of semiconductor nanoparticles. Thus, the primary matrix material of the primary particle may contain a single type of semiconductor nanoparticle, e.g., InP, InP/ZnS or CdSe, of a specific size range, such that the plurality of QD-containing beads emits monochromatic light of a predefined wavelength, i.e., colour. The colour of the emitted light may be adjusted by varying the type of semiconductor nanoparticle material used, e.g., changing the size of the nanoparticle, the nanoparticle core semiconductor material and/or adding one or more outer shells of different semiconductor materials.

Moreover, colour control may also be achieved by incorporating different types of semiconductor nanoparticles, for examples nanoparticles of different size and/or chemical composition within the primary matrix material of each particle.

Furthermore, the colour and colour intensity may be controlled by selecting an appropriate number of semiconductor nanoparticles within each particle. Preferably each primary particle contains at least around 1000 semiconductor nanoparticles of one or more different types, more preferably at least around 10,000, more preferably at least around 50,000, and most preferably at least around 100,000 semiconductor nanoparticles of one or more different types.

Where the primary particles are provided in the preferred form of beads or microbeads, some or all of the beads preferably contain one or more semiconductor nanoparticles capable of secondary light emission upon excitation by primary light emitted by a primary light source (e.g., an LED).

The primary particles may be dispersed within an encapsulating medium, such as an LED encapsulant, to provide a robust QD-containing formulation which may then safely be used in subsequent processing steps, for example, to deposit a desired amount of such a formulation on to an LED chip to provide an QD/LED-based light-emitting device. Any desirable number of beads may be dispersed or embedded within the encapsulating medium; for example, the formulation may contain 1 to 10,000 beads, more preferably 1 to 5000 beads, and most preferably 5 to 1000 beads.

It should also be appreciated that the encapsulating medium may have embedded therein one or more type of semiconductor nanoparticle-containing primary particles. That is, two or more different types of primary particles (one or more containing the nanoparticles) may be embedded within the same encapsulating medium. In this way, where the population of nanoparticles contains more than one different type of nanoparticle, the nature of the primary particle may be selected for optimum compatibility with both the different types of nanoparticles and the particular medium used.

Advantages of quantum dot-containing beads incorporating stability-enhancing additives, optionally also incorporating a surface coating, over free quantum dots or uncoated quantum dot-containing beads may include greater stability to air and moisture, greater stability to photo-oxidation and/or greater stability to mechanical processing. Moreover, by pre-loading small microbeads, which may range in size from a few 50 nm to 500 μm, with quantum dots, adding a stability-enhancing additive and optionally coating the individual microbeads prior to incorporating a plurality of such quantum dot-containing beads into an LED encapsulation material on a UV or blue LED, it is a relatively simple process to change, in a controllable and reproducible manner, the colour of the light emitted by the resulting LED-based light-emitting device.

Semiconductor Nanoparticles

Any desirable type of semiconductor nanoparticle may be employed in embodiments of the present invention. In a preferred embodiment, the nanoparticle contains ions, which may be selected from any desirable group of the periodic table, such as but not limited to group 11, 12, 13, 14, 15 or 16 of the periodic table. The nanoparticles may incorporate transition metal ions or d-block metal ions. It is preferred that the nanoparticles contain first and second ions with the first ion preferably selected from group 11, 12, 13 or 14 and the second ion preferably selected from group 14, 15 or 16 of the periodic table. The nanoparticles may contain one or more semiconductor materials selected from the group consisting of CdO, CdS, CdSe, CdTe, ZnO, ZnS, ZnSe, ZnTe, InP, InAs, InSb, AlP, AlS, AlAs, AlSb, GaN, GaP, GaAs, GaSb, PbS, PbSe, Si, Ge, MgS, MgSe, MgTe and combinations thereof. Moreover, the nanoparticles may be binary, tertiary or quaternary core, core-shell or core-multi shell, doped or graded nanoparticles.

Any appropriate method may be employed to produce the semiconductor nanoparticles employed in the various aspects of the present invention. That being said, it is preferred that the semiconductor nanoparticles be produced by converting a nanoparticle precursor composition to the material of the nanoparticles in the presence of a molecular cluster compound under conditions permitting seeding and growth of the nanoparticles on the cluster compound. The method may employ the methodology set out in the applicant's co-pending European patent application (publication No. EP1743054A) and U.S. Publication No. 2007-0202333; both of these publications are incorporated herein by reference in their entireties.

Conveniently, the nanoparticles may incorporate first and second ions and the nanoparticle precursor composition may include first and second nanoparticle precursor species containing the first and second ions respectively which are combined, preferably in the presence of a molecular cluster compound, as exemplified below in Synthetic Methods 1.1 and 1.2.

The first and second precursor species may be separate species in the precursor composition or may form part of a single molecular species containing both the first and second ions.

In the preferred embodiments employing a molecular cluster compound, it is preferred that the molecular clusters contain third and fourth ions. At least one of the third and fourth ions is preferably different from the first and second ions contained in the first and second nanoparticle precursor species respectively. The third and fourth ions may be selected from any desirable group of the periodic table, such as but not limited to group 11, 12, 13, 14, 15 or 16 of the periodic table. The third and/or fourth ion may be a transition metal ion or a d-block metal ion. Preferably the third ion is selected from group 11, 12, 13 or 14 and the fourth ion is selected from group 14, 15 or 16 of the periodic table.

By way of example, the molecular cluster compound may incorporate third and fourth ions from groups 12 and 16 of the periodic table respectively and the first and second ions derived from the first and second nanoparticle precursor species may be taken from groups 13 and 15 of the periodic table respectively as in Synthetic Method 1.2. The methodology described in the applicant's International PCT patent application (application No. PCT/GB2008/002560) and U.S. Pat. No. 7,588,828 may be employed; both of these references are incorporated herein by reference in their entireties.

It will be appreciated that during the reaction of the first and second nanoparticle precursor species, the first nanoparticle precursor species may be added in one or more portions and the second nanoparticle precursor species may be added in one or more portions. The first nanoparticle precursor species is preferably added in two or more portions. In this case, it is preferred that the temperature of a reaction mixture containing the first and second nanoparticle precursor species is increased between the addition of each portion of the first precursor species. Additionally or alternatively, the second nanoparticle precursor species may be added in two or more portions, whereupon the temperature of a reaction mixture containing the first and second nanoparticle precursor species may be increased between the addition of each portion of the second precursor species. The methodology described in the applicant's co-pending European patent application (application No. 06808360.9) and US. Publication No. 2007-0104865 may be used; both of these references are incorporated herein by reference in their entireties.

The coordination about the final inorganic surface atoms in any core, core-shell or core-multi shell, doped or graded nanoparticle is typically incomplete, with highly reactive non-fully coordinated atoms acting as "dangling bonds" on the surface of the particle, which may lead to particle agglomeration. This problem is typically overcome by passivating (capping) the "bare" surface atoms with protecting organic groups.

In many cases, the capping agent is the solvent in which the nanoparticles have been prepared, and consists of a Lewis base compound, or a Lewis base compound diluted in an inert solvent such as a hydrocarbon. There is a lone pair of electrons on the Lewis base capping agent that are capable of a donor type coordination to the surface of the nanoparticle; ligands of this kind include, but are not limited to, mono- or multi-dentate ligands such as phosphines (trioctylphosphine, triphenylphosphine, t-butylphosphine etc.), phosphine oxides (trioctylphosphine oxide, triphenylphosphine oxide etc.), alkyl phosphonic acids, alkyl-amines (hexadecylamine, octylamine etc.), aryl-amines, pyridines, long chain fatty acids and thiophenes.

In addition to the outermost layer of organic material or sheath material (capping agent) helping to inhibit nanoparticle-nanoparticle aggregation, this layer may also protect the nanoparticles from their surrounding electronic and chemical environments, and provide a means of chemical linkage to other inorganic, biological or organic material, whereby the functional group is pointing away from the nanoparticle surface and is available to bond/react/interact with other available molecules. Examples include, but are not limited to, amines, alcohols, carboxylic acids, esters, acid chloride, anhydrides, ethers, alkyl halides, amides, alkenes, alkanes, alkynes, allenes, amino acids, azides, groups etc. The outermost layer (capping agent) of a quantum dot may also consist of a coordinated ligand that processes a functional group that is polymerisable and may be used to form a polymer layer around the nanoparticle. The outermost layer may also consist of organic units that are directly bonded to the outermost inorganic layer such as via a disulphide bond between the inorganic surface (e.g., ZnS) and a thiol capping molecule. These may also possess additional functional group(s), not bonded to the surface of the particle, which may be used to form a polymer around the particle, or for further reaction/interaction/chemical linkage.

An example of a material to which nanoparticle surface binding ligands may be linked is the primary matrix material from which the primary particles are formed. There are a number of approaches to incorporate semiconductor nanoparticles, such as quantum dots, into the types of primary matrix materials described hereinbefore by pre-coating the nanoparticles with ligands that are compatible in some way with the matrix material of the primary particles. By way of example, in the preferred embodiment where the semiconductor nanoparticles are to be incorporated into polymeric beads, the nanoparticles may be produced so as to possess surface ligands which are polymerizable, hydrophobic, hydrophilic, positively or negatively charged, or functionalised with a reactive group capable of associating with the polymer of the polymeric beads by chemical reaction, covalent linkage or non-covalent interaction (e.g., interchelation).

The inventors have determined that one may take quantum dots prepared using any desirable method, incorporate these quantum dots into silica or polymer beads also including at least one type of stability-enhancing additive, and then optionally coat the beads with a protective barrier layer of a material such as a polyacrylate or dielectric metal oxide like aluminium oxide, to provide significantly more robust, easily processible quantum dot-containing materials. Quantum dot-containing beads of this kind may be employed in a wide range of applications, particularly, but not exclusively, the fabrication of LED-based light-emitting devices wherein the QD-beads are embedded within a host LED encapsulant and then deposited onto a solid-state LED chip to form a quantum dot-based light-emitting device.

Incorporating Quantum Dots into Beads

Figure 4:
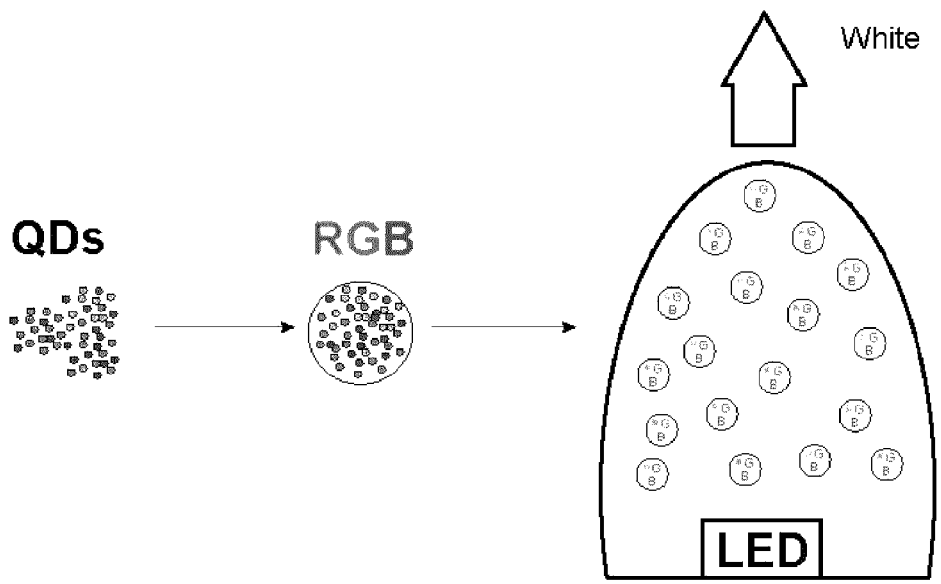
FIG. 4 is a schematic representation of an additive-containing QD-bead-based light-emitting device employing multi-coloured, multiple quantum dot types in each bead such that each bead emits white secondary light.
Figure 5:
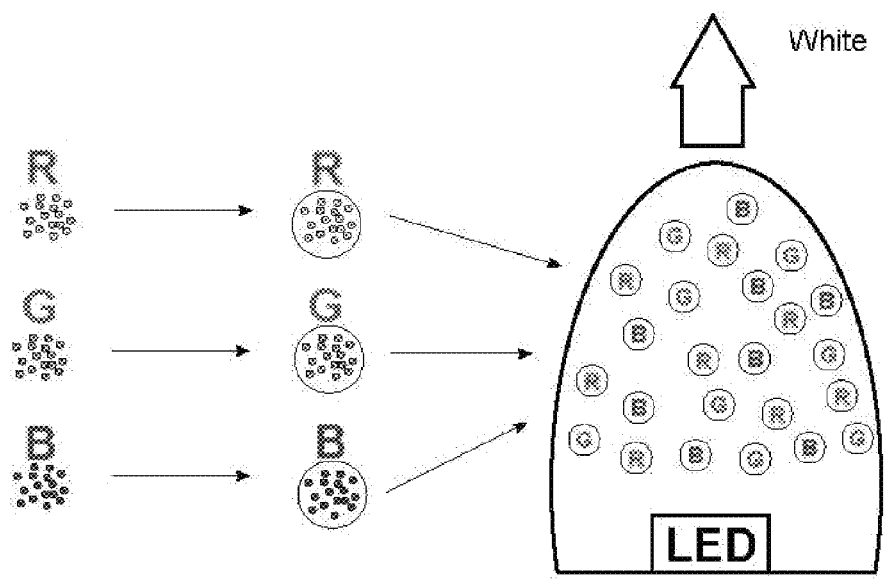
FIG. 5 is a schematic representation of an additive-containing QD-bead-based light-emitting device employing multi-coloured, multiple quantum dot types in different beads such that each bead contains a single quantum dot type emitting a single colour, a mixture of the beads combining to produce white secondary light.
Figure 6:
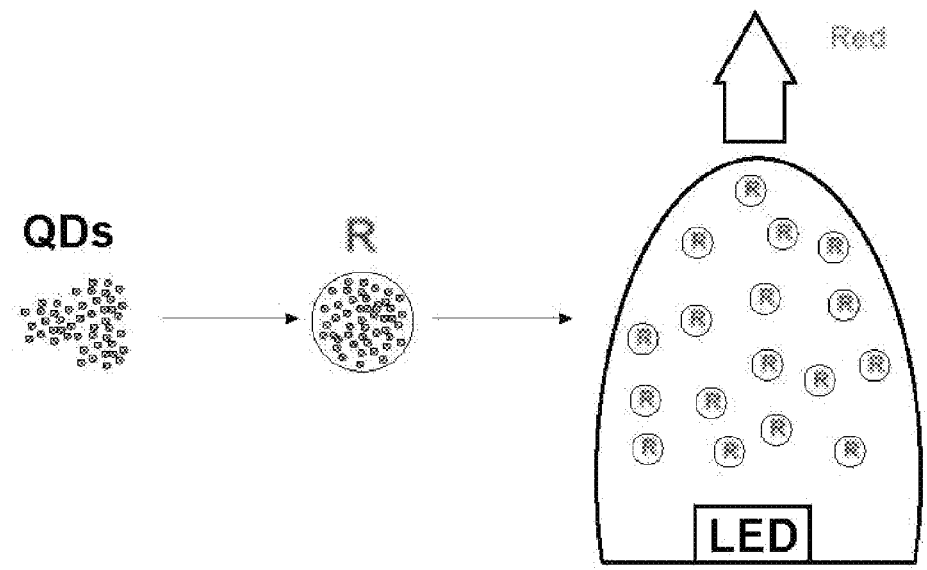
FIG. 6 is a schematic representation of an additive-containing QD-bead-based light-emitting device employing a singly coloured, single quantum dot type in all beads such that a mixture of the beads emits a single colour of secondary light (in this case, red light)
Figure 7:
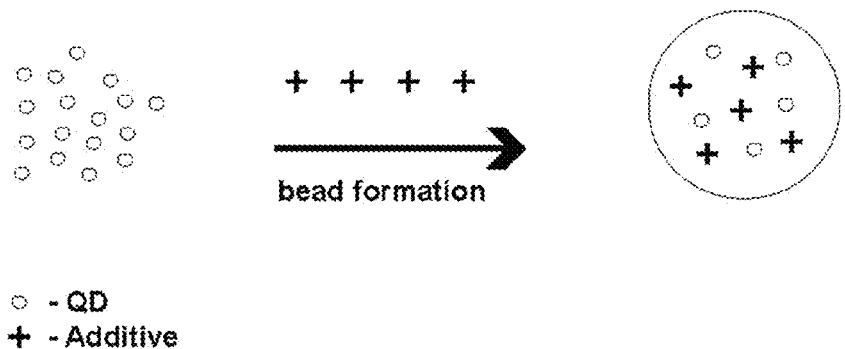
FIG. 7 is a schematic representation of a process according to a first embodiment of the present invention wherein an additive is combined with a population of quantum dots during formation of a primary particle containing the quantum dots and, consequently, the additive.
Figure 8:
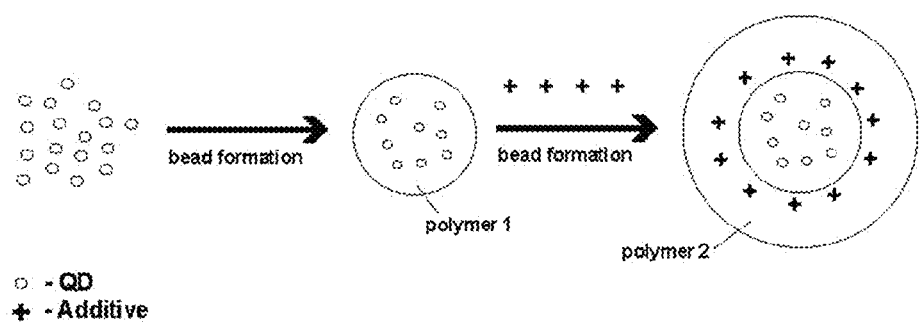
FIG. 8 is a schematic representation of a process according to a second embodiment of the present invention wherein quantum dots are first encapsulated within a bead formed of a first type of polymer (polymer 1) and then an additive is combined with the quantum dot-containing bead during formation of a primary particle made from a second type of polymer (polymer 2) containing the quantum dot-containing bead and, consequently, the additive.
Figure 9:
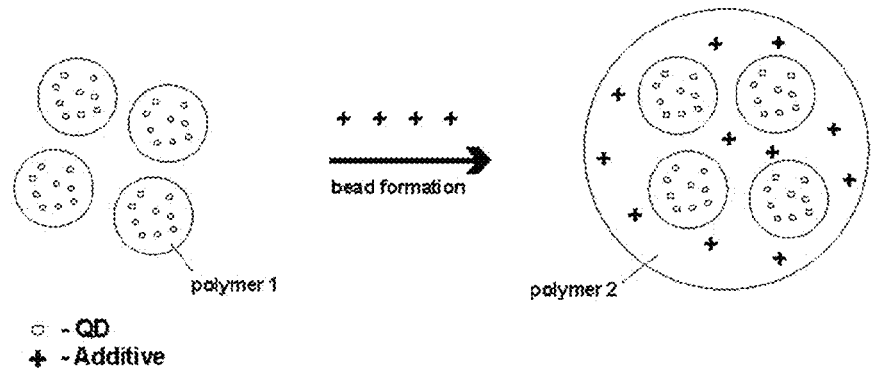
FIG. 9 is a schematic representation of a process according to a third embodiment of the present invention wherein quantum dots are first encapsulated within a population of beads formed of a first type of polymer (polymer 1) and then an additive is combined with the quantum dot-containing beads during formation of a primary particle made from a second type of polymer (polymer 2) containing the quantum dot-containing beads and, consequently, the additive.
Figure 10:
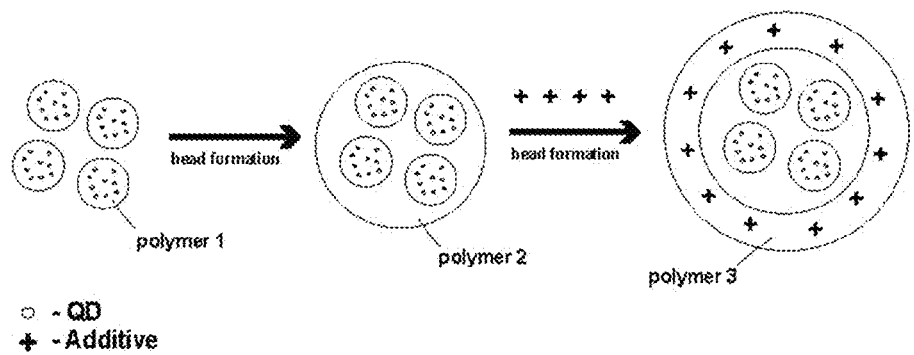
FIG. 10 is a schematic representation of a process according to a fourth embodiment of the present invention wherein quantum dots are first encapsulated within a population of beads formed of a first type of polymer (polymer 1), which are then encapsulated within a bead formed of a second type of polymer (polymer 2), and then an additive is combined with the quantum dot-containing beads during formation of a primary particle made from a third type of polymer (polymer 3) containing the quantum dot-containing beads and, consequently, the additive.

Considering the initial step of incorporating quantum dots into beads, a first option is to incorporate the quantum dots directly into the beads. A second option is to immobilise the quantum dots in beads through physical entrapment. These methods may be used to make a population of beads that contain just a single type of quantum dot (e.g., one colour) by incorporating a single type of quantum dot into the beads. Alternatively, beads that contain 2 or more types of quantum dots (e.g., two or more colours) may be constructed by incorporating a mixture of two or more types of quantum dot (e.g., material and/or size) into the beads. Such mixed beads may then be combined in any suitable ratio to emit any desirable colour of secondary light following excitation by the primary light emitted by the primary light source (e.g., LED). This is exemplified in FIGS. 4 to 6 below which schematically show QD-bead light-emitting devices including respectively: a) multi-coloured, multiple quantum dot types in each bead such that each bead emits white secondary light; b) multi-coloured, multiple quantum dot types in different beads such that each bead contains a single quantum dot type emitting a single colour, a mixture of the beads combining to produce white secondary light; and c) singly coloured, single quantum dot type in all beads such that a mixture of the beads emits a single colour of secondary light, e.g., red.

The or each stability-enhancing additive may be added to the quantum dot-containing beads during initial bead formation and/or after the beads have been formed independently of which of the two options set out above are employed to incorporate the quantum dots within the beads.

Incorporating Quantum Dots Beads During Bead Formation

With regard to the first option of incorporating the quantum dots directly into the primary particles (i.e., the beads) during bead formation, by way of example, suitable core, core/shell or core/multishell nanoparticles (e.g., InP/ZnS core/shell quantum dots) may be contacted by one or more bead precursors (e.g., an acrylate monomer, a silicate material, or a combination of both) and then subjected to suitable conditions (e.g., introduction of a polymerisation initiator) to form the bead material. One or more stability-enhancing additive may be included in the reaction mixture in which the nanoparticles are contacted by the bead precursors. Moreover, at this stage, a surface coating may be applied to the beads.

By way of further example, hexadecylamine-capped CdSe-based semiconductor nanoparticles may be treated with at least one, more preferably two or more polymerisable ligands (optionally one ligand in excess) resulting in the displacement of at least some of the hexadecylamine capping layer with the polymerisable ligand(s). The displacement of the capping layer with the polymerisable ligand(s) may be accomplished by selecting a polymerisable ligand or ligands with structures similar to that of trioctylphosphine oxide (TOPO), which is a ligand with a known and very high affinity for CdSe-based nanoparticles. It will be appreciated that this basic methodology may be applied to other nanoparticle/ligand pairs to achieve a similar effect. That is, for any particular type of nanoparticle (material and/or size), one or more appropriate polymerisable surface binding ligands may be selected by choosing polymerisable ligands including a structural motif which is analogous in some way (e.g., has a similar physical and/or chemical structure) to the structure of a known surface binding ligand. Once the nanoparticles have been surface-modified in this way, they may then be added to a monomer component of a number of microscale polymerisation reactions to form a variety of quantum dot-containing resins and beads.

Examples of polymerisation methods that may be used to construct quantum dot-containing beads include, but are not limited to, suspension, dispersion, emulsion, living, anionic, cationic, RAFT, ATRP, bulk, ring closing metathesis and ring opening metathesis. Initiation of the polymerisation reaction may be caused by any appropriate means that causes the monomers to react with one another, such as free radicals, light, ultrasound, cations, anions, heat.

A preferred method is suspension polymerisation involving thermal curing of one or more polymerisable monomers from which the primary matrix material is to be formed. The polymerisable monomers may, for example, include methyl (meth)acrylate, ethylene glycol dimethacrylate and/or vinyl acetate.

Quantum dot-containing beads may be generated simply by adding quantum dots to the mixture of reagents used to construct the beads. In some instances quantum dots (nascent quantum dots) may be used as isolated from the reaction employed to synthesise them and are thus generally coated with an inert outer organic ligand layer. In an alternative procedure a ligand exchange process may be carried out prior to the bead forming reaction. Here one or more chemically reactive ligands (for example this might be a ligand for the quantum dots which also contains a polymerisable moiety) is added in excess to a solution of nascent quantum dots coated in an inert outer organic layer. After an appropriate incubation time the quantum dots are isolated, for example by precipitation and subsequent centrifugation, washed and then incorporated into the mixture of reagents used in the bead forming reaction/process.

Both quantum dot incorporation strategies result in statistically random incorporation of the quantum dots into the beads and thus the polymerisation reaction result in beads containing statistically similar amounts of the quantum dots and, optionally, the one or more additives. Bead size may be controlled by the choice of polymerisation reaction used to construct the beads, and additionally, once a polymerisation method has been selected, bead size may also be controlled by selecting appropriate reaction conditions, e.g., in a suspension polymerisation reaction by stirring the reaction mixture more quickly to generate smaller beads. Moreover the shape of the beads may be readily controlled by choice of procedure in conjunction with whether or not the reaction is carried out in a mould. The composition of the beads may be altered by changing the composition of the monomer mixture from which the beads are constructed. Similarly the beads may also be cross-linked with varying amounts of one or more cross-linking agents (e.g., divinyl benzene). If beads are constructed with a high degree of cross-linking, e.g., greater than 5 mol % cross-linker, it may be desirable to incorporate a porogen (e.g., toluene or cyclohexane) during the reaction used to construct the beads. The use of a porogen in such a way leaves permanent pores within the matrix constituting each bead. These pores may be sufficiently large to allow the ingress of quantum dots into the bead.

Incorporating Quantum Dots into Prefabricated Beads

In respect of the second option for incorporating quantum dots into the primary particles, the quantum dots may be immobilised within the primary matrix material through physical entrapment. For example, a solution of quantum dots in a suitable solvent (e.g., an organic solvent) may be incubated with a sample of primary particles. Removal of the solvent using any appropriate method results in the quantum dots becoming immobilised within the primary matrix material of the primary particles. The quantum dots remain immobilised in the particles unless the sample is resuspended in a solvent (e.g., an organic solvent) in which the quantum dots are freely soluble. One or more stability-enhancing additives may, for example, be included in the quantum dot solution which is incubated with the primary particles. Alternatively, the quantum dots may first be added to the primary particles, and the one or more additives then added to the primary particles. Additionally, at this stage, a surface coating may be applied to the primary particles if desired.

In a further preferred embodiment, at least a portion of the semiconductor nanoparticles may be physically attached to the prefabricated primary particles. Attachment may be achieved by immobilisation of a portion of the semiconductor nanoparticles within the polymer matrix of the prefabricated primary particles or by chemical, covalent, ionic, or physical connection between the semiconductor nanoparticles and the prefabricated primary particles. In a particularly preferred embodiment the prefabricated primary particles include polystyrene, polydivinyl benzene and a polythiol.

Quantum dots may be irreversibly incorporated into prefabricated primary particles in a number of ways, e.g., chemical, covalent, ionic, physical (e.g., by entrapment) or any other form of interaction. If prefabricated primary particles are to be used for the incorporation of quantum dots, the solvent accessible surfaces of the primary particles may be chemically inert (e.g., polystyrene) or alternatively they may be chemically reactive/functionalised (e.g., Merrifield's Resin). The chemical functionality may be introduced during the construction of the primary particles, for example by the incorporation of a chemically functionalised monomer, or alternatively, chemical functionality may be introduced in a post-particle construction treatment step, for example by conducting a chloromethylation reaction. Additionally chemical functionality may be introduced by a post-particle construction step involving a polymeric graft or other similar process whereby chemically reactive polymer(s) are attached to the outer layers/accessible surfaces of the bead. More than one such post construction derivatisation process may be carried out to introduce chemical functionality onto/into the primary particles.

As with quantum dot incorporation into primary particles during the particle forming reaction (i.e., the first option described above) the pre-fabricated primary particles may be of any shape, size and composition and may have any degree of cross-linker and may contain permanent pores if constructed in the presence of a porogen. Quantum dots may be imbibed into the primary particles by incubating a solution of quantum dots in an organic solvent and adding this solvent to the primary particles. The solvent is preferably capable of wetting the primary particles, and in the case of lightly crosslinked primary particles, preferably 0-10% crosslinked and most preferably 0-2% crosslinked. The solvent may cause the polymer matrix to swell in addition to solvating the quantum dots. Once the quantum dot-containing solvent has been incubated with the primary particles, it may be removed, for example by heating the mixture and causing the solvent to evaporate and the quantum dots to become embedded in the primary matrix material constituting the primary particles, or alternatively, by the addition of a second solvent in which the quantum dots are not readily soluble but which mixes with the first solvent causing the quantum dots to precipitate within the primary matrix material. Immobilisation may be reversible if the primary particles are not chemically reactive, or else, if the primary particles are chemically reactive, the quantum dots may be held permanently within the primary matrix material, by chemical, covalent, ionic, or any other form of interaction. Any desirable stability-enhancing additive may be added during any of the stages of the quantum dot-bead fabrication described above.

Incorporation of Quantum Dots into Sol-Gels to produce Glass

As stated above, a preferred primary matrix material is an optically transparent media, such as a sol-gel or a glass. Such primary matrix materials may be formed in an analogous fashion to the method used to incorporate quantum dots into primary particles during the particle forming process as described above. For example, a single type of quantum dot (e.g., one colour) may be added to a reaction mixture used to produce a sol-gel or glass. Alternatively, two or more types of quantum dot (e.g., two or more colours) may be added to a reaction mixture used to produce a sol-gel or glass. The sol-gels and glasses produced by these procedures may have any shape, morphology or 3-dimensional structure. For example, the resulting primary particles may be spherical, disc-like, rod-like, ovoid, cubic, rectangular, or any of many other possible configurations. Any of the stability-enhancing additives described hereinbefore may be added to quantum dot-containing glass beads. Some silica-based beads exhibit relatively low porosity as compared, for example, to polymeric resin beads (e.g., acrylate-based beads). It may therefore be advantageous to add the or each additive during initial bead formation when the beads are made from a silica-based material rather than adding the additive(s) after bead formation, which may be more advantageous or desirable when using more porous bead materials.

Application of Optional Surface Coating

In a preferred embodiment, where it is desired to provide a surface coating including an inorganic material on the quantum dot-containing primary particles, such as a metal oxide or metal nitride, a particularly preferred process to deposit the coating is atomic layer deposition (ALD), although it will be appreciated that other suitable techniques may be employed.

The provision of a surface coating by ALD, using a metal oxide surface coating as an example, typically includes the following four basic steps:
1) Exposing a surface of a quantum dot-containing primary particle to a metal precursor;
2) Purging the reaction chamber containing the primary particles to remove non-reacted metal precursor and any gaseous reaction by-products;
3) Exposing the surface of the primary particles to an oxide precursor; and
4) Purging the reaction chamber.

The above steps may then be repeated any desirable number of times to provide a surface coating of the desired thickness, for example, a thickness of around 1 to 500 nm. Each reaction cycle adds a predetermined amount of coating material to the surface of the primary particles. One cycle may take from around 0.5 seconds to around 2-3 seconds and deposit between 1 and 30 nm of surface coating.

Before initiating the ALD process, it is preferred that the surface of the primary particles be heat treated to ensure their stability during the ALD process. It will be appreciated that since ALD is essentially a surface-controlled process, where process parameters other than the precursors, substrate (i.e., primary particle material), reaction temperature (typically around 100 to 400° C., but may be as high as 500° C.), and, to a lesser extent pressure (typically around 1 to 10 mbar), have little or no influence on the final surface coating, ALD-grown surface layers or films are extremely conformal and uniform in thickness, making ALD is a particularly preferred method for depositing protective coatings on to the surface of quantum dot-containing primary particles.

A particularly preferred surface coating is $Al_2O_3$. An $Al_2O_3$ surface coating of only up to around 20 to 30 nm applied by ALD at a temperature of around 100 to 175° C. using trimethylaluminium and water as precursors may exhibit a very low water vapour transmission rate and permeability to other gases and liquids.

It has been determined that ALD coatings applied to quantum dot-containing primary particles often result in the deposition of a greater quantity of the surface coating material, e.g., $Al_2O_3$ than would be anticipated if the only surface being coated was the external surface of the primary particle. It has been established that an improvement in the level or protection afforded by the surface coating may be achieved by increasing the amount of surface coating material deposited beyond the amount theoretically required to coat just the calculated external surface area. While the inventors do not wish to be bound by any particular theory, it is believed that this is at least partly due to the ALD process coating not just the external surface area of the primary particles, but that it deposits coating material on at least some, if not substantially all of the accessible or effective surface area of the primary particle which includes internal voids that are accessible from the outside of the primary particle. Thus, when porous, and particularly when highly porous polymeric bead-type materials are coated using ALD, it has been observed that the coating material is deposited inside the voids and pores of the primary particles, as well as the outermost surface of the particles. In this way, the ALD process may be used to reduce the porosity of the quantum dot-containing primary particles to unexpectedly and surprisingly low levels, thereby providing a degree of protection to the particles which is beyond that which would have been anticipated by the skilled person. This has important consequences in terms of the processibility and optical performance of the final coated quantum dot-containing primary particles, both of which may be greatly enhanced compared to prior art quantum dot-based materials, by the use of ALD to provide a surface coating of, for example, $Al_2O_3$.

By way of example, it is known that heat treatment of prior art quantum dot-containing materials to the temperatures typically required during LED manufacture (200° C. and above) degrades the performance of the materials to unacceptably low levels. Moreover, the ability to photobrighten such materials is also significantly diminished or effectively lost following heat treatment. This places serious limitations on the use of quantum dot-based materials in applications such as LED fabrication, as well as other manufacturing processes involving heat treatment of components. Aspects of the present invention, however, offer convenient solutions to these problems with prior art materials and methods. By the use of ALD to deposit a coating material, such as but not limited to $Al_2O_3$, to primary particles containing quantum dots, the coated materials may be heat treated at temperatures of up to at least 250° C. Not only do the materials remain structurally sound but they may also be photobleached to substantially restore their original quantum emission (i.e., before coating and heat treatment).

In an alternative preferred embodiment, the surface coating may be produced in-situ on the surface of the primary particles. By way of example, a surface of quantum dot-containing primary particles may be contacted by polymerisable monomers which are then polymerised on the surface of the particles to produce a polymeric surface coating on the particles. One method by which contacting of the particles by the monomers may be effected is to disperse the particles within a monomer mixture, optionally including a crosslinking agent and, if necessary, a polymerisation initiator, such as a photoinitiator. Polymerisation may then be effected in any manner appropriate for the monomers being used. For example, if photopolymerisable monomers are used, then the polymer mixture containing the primary particles and the optional photoinitiator may then be exposed to a suitable source of radiation (e.g., UV).

FIGS. 11 to 14 depict alternative preferred arrangements of quantum dot-containing primary particles provided directly or indirectly with a protective surface coating.

Figure 11:
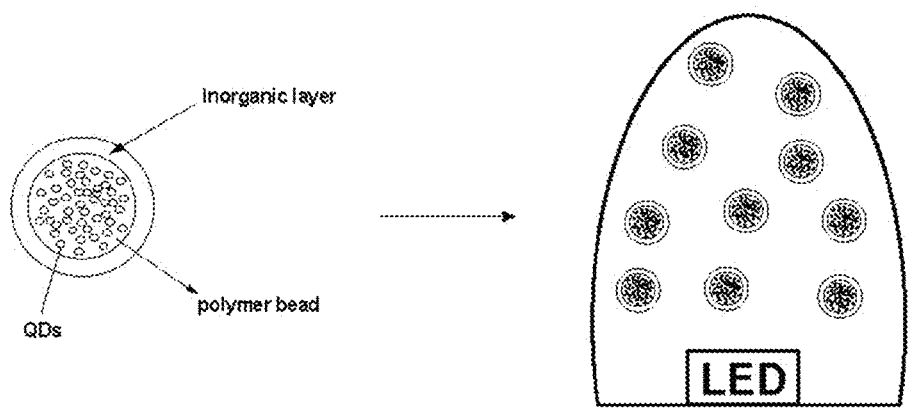
FIG. 11 is a schematic representation of a population of quantum dots entrapped within a primary particle in the form of a polymer bead according to a preferred embodiment of the present invention in which the primary particle is provided with a surface coating of an inorganic material, and the primary particles are dispersed within a secondary matrix material in the form of an LED encapsulant disposed on an LED to provide a light-emitting device according to a preferred embodiment of the present invention.
Figure 12:
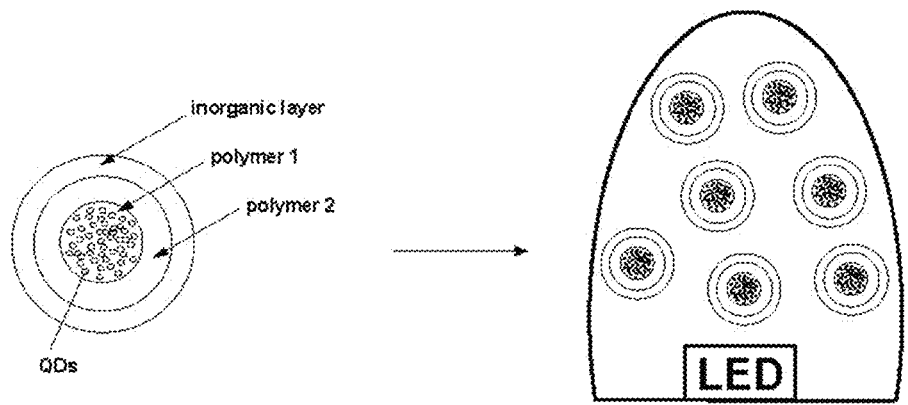
FIG. 12 is a schematic representation of a population of quantum dots entrapped within a primary particle in the form of a polymer bead made from a first type of polymer (polymer 1) which is encapsulated within a second type of polymer material (polymer 2) which is provided with a surface coating of an inorganic material according to a preferred embodiment of the present invention, and the encapsulated primary particles are dispersed within a secondary matrix material in the form of an LED encapsulant disposed on an LED to provide a light-emitting device according to a preferred embodiment of the present invention.
Figure 13:
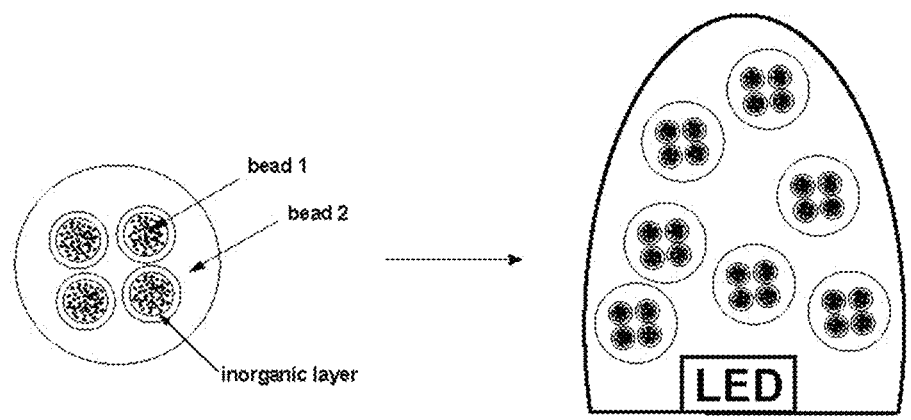
FIG. 13 is a schematic representation of a population of quantum dots entrapped within a population of primary particles in the form of polymer beads (bead 1) according to a preferred embodiment of the present invention in which each of the primary particles is provided with a surface coating of an inorganic material, before the coated primary particles are dispersed within a second type of bead (bead 2) to produce a "bead-in-bead" composite material, and then the bead-in-bead composite material is dispersed within a secondary matrix material in the form of an LED encapsulant disposed on an LED to provide a light-emitting device according to a preferred embodiment of the present invention.
Figure 14:
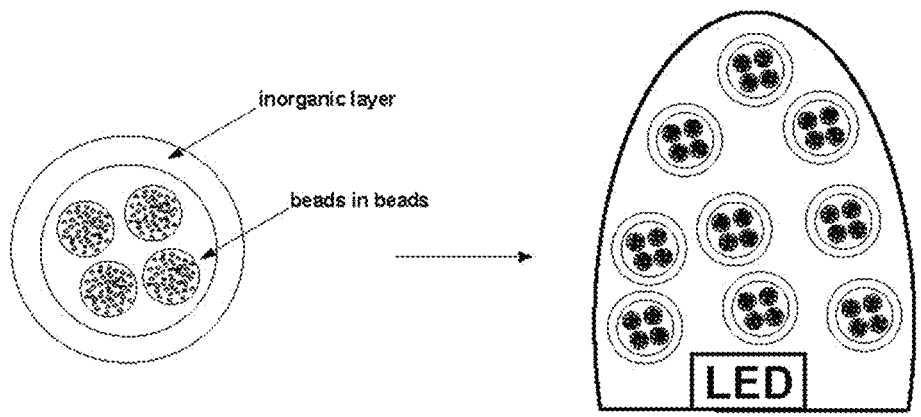
FIG. 14 is a schematic representation of a population of quantum dots entrapped within a population of primary particles in the form of polymer beads according to a preferred embodiment of the present invention, the population of primary particles being dispersed within a second type of bead to produce a "bead-in-bead" composite material which is then provided with an inorganic surface coating layer, and then the bead-in-bead composite material is dispersed within a secondary matrix material in the form of an LED encapsulant disposed on an LED to provide a light-emitting device according to a preferred embodiment of the present invention.

FIG. 11 illustrates a population of quantum dots entrapped within a primary particle in the form of a polymer bead according to a preferred embodiment of the present invention. The primary particle is provided with a surface coating of an inorganic material, before being dispersed within a secondary matrix material in the form of an LED encapsulant disposed on an LED to provide a light-emitting device according to a preferred embodiment of the present invention. FIG. 12 depicts a population of quantum dots entrapped within a primary particle in the form of a polymer bead made from a first type of polymer (polymer 1) which is encapsulated within a second type of polymer material (polymer 2). The surface of the second type of polymer is provided with a protective surface coating of an inorganic material according to a preferred embodiment of the present invention. The encapsulated primary particles are then dispersed within a secondary matrix material in the form of an LED encapsulant disposed on an LED to provide a light-emitting device according to a preferred embodiment of the present invention. FIG. 13 illustrates a population of quantum dots entrapped within a population of primary particles in the form of polymer beads (bead 1) according to a preferred embodiment of the present invention in which each of the primary particles is provided with a surface coating of an inorganic material. The coated primary particles are shown dispersed within a second type of bead (bead 2) to produce a "bead-in-bead" composite material, which may be dispersed, as shown, within a secondary matrix material in the form of an LED encapsulant disposed on an LED to provide a light-emitting device according to a preferred embodiment of the present invention. FIG. 14 depicts a population of quantum dots entrapped within a population of primary particles in the form of polymer beads according to a preferred embodiment of the present invention, the population of primary particles being dispersing within a second type of bead to produce a "bead-in-bead" composite material which is then provided with an inorganic surface coating layer. The coated bead-in-bead composite material may then be dispersed within a secondary matrix material as shown in the form of an LED encapsulant disposed on an LED to provide a light-emitting device according to a preferred embodiment of the present invention.

Application of QD-Beads—
Incorporation into LED Encapsulant

While the addition of one or more additives to beads containing quantum dots has many advantages as outlined above, one significant advantage of embodiments of the present invention is that additive-containing quantum dot-beads (QD-beads) produced as described above may be incorporated into commercially available LED encapsulant materials simply by weighing the desired amount of the QD-bead material and adding this to the desired amount of LED encapsulant material.

It is preferred that the bead/encapsulant composite be mixed thoroughly to provide a homogeneous mixture. The mixture may then be dispensed onto a commercially available LED and cured according to normal curing procedures for the particular LED-encapsulant used. The additive-containing QD-beads thus provide a simple and straightforward way of facilitating the formulation of bead/LED encapsulant composites which may be used in the fabrication of next generation, higher performance light-emitting devices using, as far as possible, standard commercially available materials and methods.

LED Encapsulating Materials

Any existing commercially available LED encapsulant may be used with additive-containing QD-beads produced according to embodiments of the present invention. Preferred LED encapsulants include silicones, epoxies, (meth)acrylates and other polymers, although it will be appreciated by the skilled person that further options are available, such as but not limited to silica glass, silica gel, siloxane, sol gel, hydrogel, agarose, cellulose, epoxy, polyether, polyethylene, polyvinyl, poly-diacetylene, polyphenylene-vinylene, polystyrene, polypyrrole, polyimide, polyimidazole, polysulfone, polythiophene, polyphosphate, poly(meth)acrylate, polyacrylamide, polypeptide, polysaccharide and combinations thereof.

LED encapsulants which may be used include, but are not limited to, UV curable encapsulants and heat-curable encapsulants, including encapsulants which require one or more catalysts to support the curing process. Specific examples of commercially available silicone encapsulants which are suitable may be selected from the group consisting of SCR1011, SCR1012, SCR1016. LPS-3412 (all available from Shin Etsu) and examples of suitable epoxy encapsulants may be selected from the group consisting of Pacific Polytech PT1002, Fine Polymers Epifine EX-1035A, and Fine Polymers Epifine X-1987.

Colour Indexing

The colour of the light output from an additive-containing QD-bead-LED (the "secondary light") may be measured using a spectrometer. The spectral output (mW/nm) may then be processed mathematically so that the particular colour of the light-emitting device may be expressed as colour coordinates on a chromaticity diagram, for example the 2° CIE 1931 chromaticity diagram (see FIG. 2).

Figure 3:
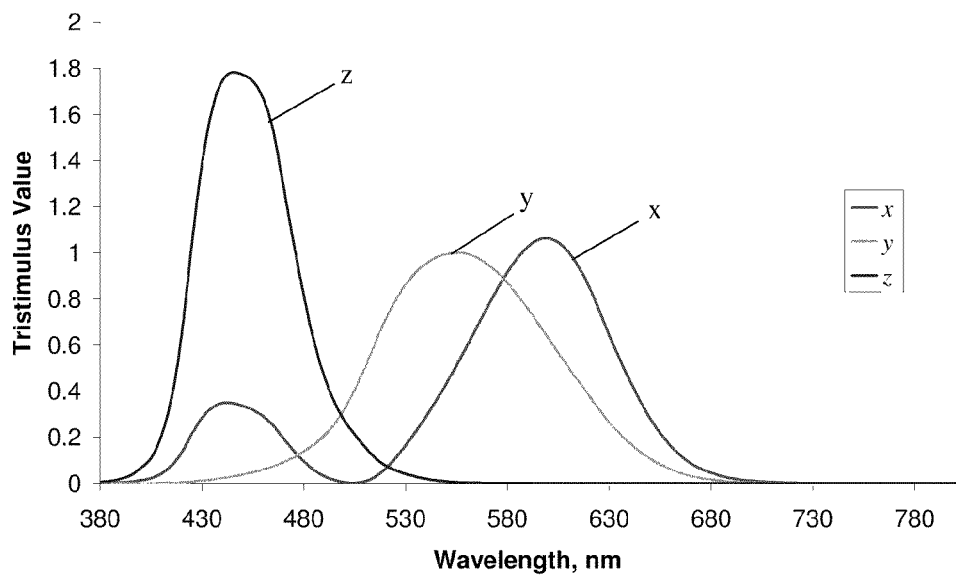
FIG. 3 is a 2° CIE 1931 colour matching diagram matching functions x, y, z.

The 2° CIE 1931 chromaticity coordinates for a particular spectrum may be calculated from the spectral power distribution and the CIE 1931 colour matching functions x, y, z (see FIG. 3). The corresponding tristimulus values may be calculated thus $X = \int p x d\lambda \, Y = \int p y d\lambda \, Z = \int p z d\lambda$ Where p is the spectral power, and x, y and z are the colour matching functions.

From X, Y, and Z the chromaticity coordinates x, y may be calculated according to $$x = \frac{X}{X+Y+Z} \text{ and } y = \frac{Y}{X+Y+Z}$$

Figure 2:
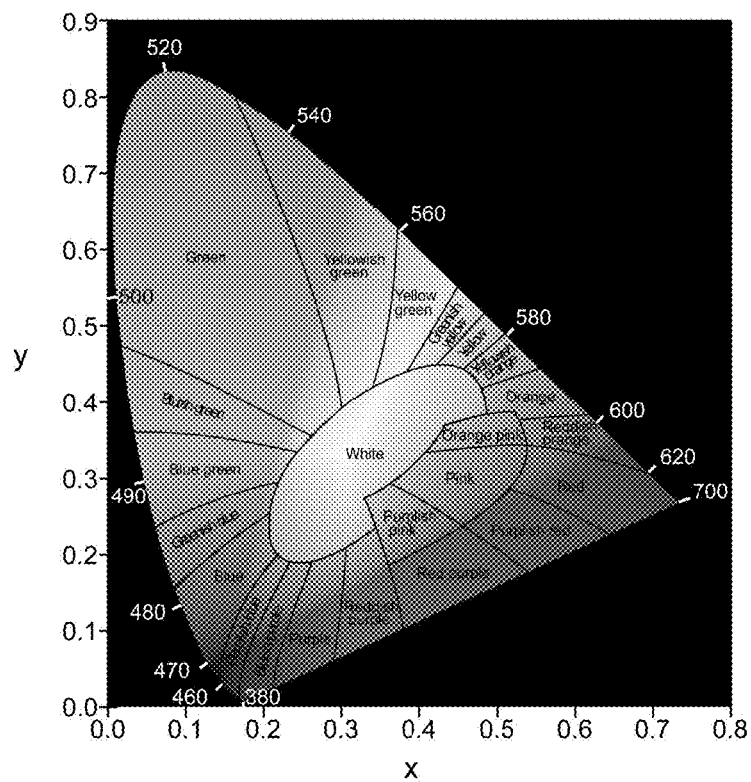
FIG. 2 is a 2° CIE 1931 chromaticity diagram.

Using x, y as the coordinates, a two-dimensional chromaticity diagram (the CIE 1931 colour space diagram) may be plotted which is analogous to the exemplary diagram depicted in FIG. 2.

Colour Rendering

Colour rendering describes the ability of a light source to illuminate objects such that they appear the correct colour when compared to how they appear when illuminated by a reference light source. Usually the reference light source is a tungsten filament bulb which is assigned a colour rendering index (CRI) of 100. To be acceptable for general lighting, a white light-emitting device source typically has a CRI>80. An example of poor colour rendering is the sodium street lamp which has very poor colour rendering capability, i.e., it is difficult to distinguish a red car from a yellow car illuminated by a sodium lamp, in the dark under a sodium lamp they both appear grey.

Embodiments of the present invention provide a plurality of robust, high-performance additive-containing QD-beads which may be used to fabricate a light-emitting device. The quantum dots within the primary particles or beads generally are in optical communication with a primary solid-state photon/light source (e.g., an LED, laser, arc lamp or black-body light source) such that, upon excitation by primary light from the primary light source the quantum dots within the primary particles emit secondary light of a desired colour. The required intensities and emission wavelengths of the light emitted from the device itself may be selected according to appropriate mixing of the colour of the primary light with that of the secondary light(s) produced from the down-conversion of the primary light by the quantum dots. Moreover, the size (and thus emission) and number of each type of quantum dot within the primary particles may be controlled, as may the size, morphology and constituency of the primary matrix material making up the primary particles, such that subsequent mixing of the quantum dot-containing media allows light of any particular colour and intensity to be produced.

It will be appreciated that the overall light emitted from the device may consist effectively of the light emitted from the quantum dots, i.e., just the secondary light, or a mixture of light emitted from the quantum dots and light emitted from the solid-state/primary light source, i.e., a mixture of the primary and secondary light. Colour mixing of the quantum dots may be achieved either within the quantum dot-containing media (e.g., within each bead in a population of beads such that each bead contains a number of different size/colour emitting quantum dots) or a mixture of differently coloured primary matrix materials with all the quantum dots within a specific matrix material being the same size/colour (e.g., some beads containing all green quantum dots and others containing all red quantum dots).

EXAMPLES

Examples 1 and 2 below describe the preparation of additive-containing quantum dot beads, and Example 3 describes how to coat such beads, which could, for example, be in used in the fabrication of new, improved quantum dot-based light-emitting devices. The Synthetic Methods section provides two methods for producing quantum dots (1.1 and 1.2) and three methods for incorporating quantum dots into primary particles or "beads" (2.1, 2.2 and 2.3).

Synthetic Methods 1.1 Preparation of CdSe/ZnS Core/Shell Quantum Dots

Preparation of CdSe Cores

HDA (500 g) was placed in a three-neck round bottomed flask and dried and degassed by heating to 120° C. under a dynamic vacuum for >1 hour. The solution was then cooled to 60° C. To this was added 0.718 g of $[HNEt_3]_4[Cd_{10}Se_4(SPh)_{16}]$ (0.20 mmols). In total 42 mmols, 22.0 ml of TOPSe and 42 mmols, (19.5 ml, 2.15 M) of $Me_2Cd$.TOP was used. Initially 4 mmol of TOPSe and 4 mmols of $Me_2Cd$.TOP were added to the reaction at room temperature and the temperature increased to 110° C. and allowed to stir for 2 hours. The reaction was a deep yellow colour, the temperature was progressively increased at a rate of ~1° C./5 min with equimolar amounts of TOPSe and $Me_2Cd$.TOP being added dropwise. The reaction was stopped when the PL emission maximum had reached ~600 nm, by cooling to 60° C. followed by addition of 300 ml of dry ethanol or acetone. This produced a precipitation of deep red particles, which were further isolated by filtration. The resulting CdSe particles were recrystallized by re-dissolving in toluene followed by filtering through Celite followed by re-precipitation from warm ethanol to remove any excess HDA, selenium or cadmium present. This produced 10.10 g of HDA capped CdSe nanoparticles. Elemental analysis C=20.88, H=3.58, N=1.29, Cd=46.43%. Max PL=585 nm, FWHM=35 nm. 38.98 mmols, 93% of $Me_2Cd$ consumed in forming the quantum dots.

Growth of ZnS Shell

HDA (800 g) was placed in a three neck round-bottom flask, dried and degassed by heating to 120° C. under a dynamic vacuum for >1 hour. The solution was then cooled to 60° C. To this was added 9.23 g of CdSe nanoparticles that have a PL maximum emission of 585 nm. The HDA was then heated to 220° C. To this was added by alternate dropwise addition a total of 20 ml of 0.5 M $Me_2Zn$.TOP and 0.5 M, 20 ml of sulfur dissolved in octylamine. Three alternate additions of 3.5, 5.5 and 11.0 ml of each were made, whereby initially 3.5 ml of sulphur was added dropwise until the intensity of the PL maximum was near zero. Then 3.5 ml of $Me_2Zn$.TOP was added dropwise until the intensity of the PL maximum had reached a maximum. This cycle was repeated with the PL maximum reaching a higher intensity with each cycle. On the last cycle, additional precursor was added once the PL maximum intensity been reached until it was between 5-10% below the maximum intensity, and the reaction was allowed to anneal at 150° C. for 1 hour. The reaction mixture was then allowed to cool to 60° C. whereupon 300 ml of dry "warm" ethanol was added which resulted in the precipitation of particles. The resulting CdSe—ZnS particles were dried before re-dissolving in toluene and filtering through Celite followed by re-precipitation from warm ethanol to remove any excess HDA. This produced 12.08 g of HDA capped CdSe—ZnS core-shell nanoparticles. Elemental analysis C=20.27, H=3.37, N=1.25, Cd=40.11, Zn=4.43%; Max PL 590 nm, FWHM 36 nm.

1.2 Preparation of InP/ZnS Core/Shell Quantum Dots

Preparation of InP Cores (500-700 nm emission)

Di-butyl ester (100 ml) and Myristic acid (10.0627 g) were placed in a three-neck flask and degassed at 70° C. under vacuum for one hour. After this period, nitrogen was introduced and the temperature increased to 90° C. ZnS molecular cluster $[Et_3NH_4][Zn_{10}S_4(SPh)_{16}]$ (4.7076 g) was added and the mixture allowed to stir for 45 minutes. The temperature was then increased to 100° C. followed by the dropwise addition of $In(MA)_3$ (1 M, 15 ml) followed by $(TMS)_3P$ (1 M, 15 ml). The reaction mixture was allowed to stir while increasing the temperature to 140° C. At 140° C., further dropwise additions of $In(MA)_3$ (1 M, 35 ml) (left to stir for 5 minutes) and $(TMS)_3P$ (1 M, 35 ml) were made. The temperature was then slowly increased to 180° C. and further dropwise additions of $In(MA)_3$ (1 M, 55 ml) followed by $(TMS)_3P$ (1 M, 40 ml) were made. By addition of the precursor in the manner described above, nanoparticles of InP could be grown with the emission maximum gradually increasing from 520 nm up to 700 nm, whereby the reaction may be stopped when the desired emission maximum has been obtained and left to stir at this temperature for half an hour. After this period, the temperature was decreased to 160° C. and the reaction mixture was left to anneal for up to 4 days (at a temperature between 20-40° C. below that of the reaction). A UV lamp was also used at this stage to aid in annealing.

The nanoparticles were isolated by the addition of dried degassed methanol (approx. 200 ml) via cannula techniques. The precipitate was allowed to settle and then methanol was removed via cannula with the aid of a filter stick. Dried degassed chloroform (approx. 10 ml) was added to wash the solid. The solid was left to dry under vacuum for 1 day. This produced 5.60 g of InP core nanoparticles. Elemental analysis: max PL=630 nm, FWHM=70 nm.

Post-Operative Treatments

The quantum yields of the InP quantum dots prepared above were increased by washing with dilute HF acid. The dots were dissolved in anhydrous degassed chloroform (~270 ml). A 50 ml portion was removed and placed in a plastic flask, flushed with nitrogen. Using a plastic syringe, the HF solution was made up by adding 3 ml of 60% w/w HF in water and adding to degassed THF (17 ml). The HF was added dropwise over 5 hrs to the InP dots. After addition was complete the solution was left to stir overnight. Excess HF was removed by extracting through calcium chloride solution in water and drying the etched InP dots. The dried dots were re-dispersed in 50 ml chloroform for future use. Max 567 nm, FWHM 60 nm. The quantum efficiencies of the core materials at this stage range from 25-90%.

Growth of ZnS Shell

A 20 ml portion of the HF etched InP core particles was dried down in a 3-neck flask. 1.3 g myristic acid and 20 ml di-n-butyl sebacate ester was added and degassed for 30 minutes. The solution was heated to 200° C., then 1.2 g anhydrous zinc acetate was added and 2 ml 1 M $(TMS)_2S$ was added dropwise (at a rate of 7.93 ml/hr) after addition was complete the solution was left to stir. The solution was kept at 200° C. for 1 hr, then cooled to room temperature. The particles were isolated by adding 40 ml of anhydrous degassed methanol and centrifuged. The supernatant liquid was disposed of and to the remaining solid 30 ml of anhydrous degassed hexane was added. The solution was allowed to settle for 5 hrs and then re-centrifuged. The supernatant liquid was collected and the remaining solid was discarded. PL emission peak Max.=535 nm, FWHM=65 nm. The quantum efficiencies of the nanoparticle core/shell materials at this stage ranged from 35-90%.

2.1 Incorporating Quantum Dots into Suspension Polymeric Beads

1% wt/vol polyvinyl acetate (PVA) (aq) solution was prepared by stirring for 12 hours followed by extensive degassing by bubbling nitrogen through the solution for a minimum of 1 hour. The monomers, methyl methacrylate and ethylene glycol dimethacrylate, were also degassed by nitrogen bubbling and used with no further purification. The initiator AIBN (0.012 g) was placed into the reaction vessel and put under three vacuum/nitrogen cycles to ensure no oxygen was present.

CdSe/ZnS core/shell quantum dots as prepared above in Method 1 were added to the reaction vessel as a solution in toluene and the solvent removed under reduced pressure. Degassed methyl methacrylate (0.98 mL) was then added followed by degassed ethylene glycol dimethacrylate (0.15 mL). The mixture was then stirred at 800 rpm for 15 minutes to ensure complete dispersion of the quantum dots within the monomer mixture. The solution of 1% PVA (10 mL) was then added and the reaction stirred for 10 minutes to ensure the formation of the suspension. The temperature was then raised to 72° C. and the reaction allowed to proceed for 12 hours.

The reaction mixture was then cooled to room temperature and the beaded product washed with water until the washings ran clear followed by methanol (100 mL), methanol/tetrahydrofuran (1:1, 100 mL), tetrahydrofuran (100 mL), tetrahydrofuran/dichloromethane (1:1, 100 mL), dichloromethane (100 mL), dichloromethane/tetrahydrofuran (1:1, 100 mL), tetrahydrofuran (100 mL), tetrahydrofuran/methanol (1:1, 100 mL), methanol (100 mL). The quantum dot-containing beads (QD-beads) were then dried under vacuum and stored under nitrogen.

2.2 Adsorbing Quantum Dots into Prefabricated Beads

Polystyrene microspheres with 1% divinyl benzene (DVB) and 1% thiol co-monomer were resuspended in toluene (1 mL) by shaking and sonication. The microspheres were centrifuged (6000 rpm, approx 1 min) and the supernatant decanted. This was repeated for a second wash with toluene and the pellets then resuspended in toluene (1 mL).

InP/ZnS quantum dots as prepared above in Method 2 were dissolved (an excess, usually 5 mg for 50 mg of microspheres) in chloroform (0.5 mL) and filtered to remove any insoluble material. The quantum dot-chloroform solution was added to the microspheres in toluene and shaken on a shaker plate at room temperature for 16 hours to mix thoroughly.

The quantum dot-microspheres were centrifuged to pellet and the supernatant decanted off, which contained any excess quantum dots present. The pellet was washed (as above) twice with toluene (2 mL), resuspended in toluene (2 mL), and then transferred directly to glass sample vials used in an integrating sphere. The glass vials were pelleted down by placing the vials inside a centrifuge tube, centrifuging and decanting off excess toluene. This was repeated until all of the material had been transferred into the sample vial. A quantum yield analysis was then run directly on the pellet, wet with toluene.

2.3 Incorporation of Quantum Dots into Silica Beads 0.4 mL of InP/ZnS core shell quantum dots capped with myristic acid (around 70 mg of inorganic) was dried under vacuum. 0.1 mL of (3-(trimethoxysilyl)propyl methacrylate (TMOPMA), followed by 0.5 mL of triethylorthosilicate (TEOS) was injected to dissolve the dried quantum dots and form a clear solution, which was kept for incubation under $N_2$ overnight. The mixture was then injected into 10 mL of a reverse microemulsion (cyclohexane/CO-520, 18 ml/1.35 g) in 50 mL flask, under stirring @ 600 rpm. The mixture was stirred for 15 mins and then 0.1 mL of 4% $NH_4OH$ was injected to start the bead forming reaction. The reaction was stopped the next day by centrifugation to collect the solid phase. The obtained particles were washed twice with 20 mL cyclohexane and then dried under vacuum.

Example 1

Addition of Additive(s) to QD-Containing Beads

Any of the stability-enhancing additives set out hereinbefore may be added to a quantum dot solution before processing the solution into beads (e.g., mixed with a suitable monomer, crosslinker, and optionally other ingredients), or added later to the pre-formed beads by incubation into a solution of the additive, i.e., soaking, for a suitable period of time. Soaking procedures for the addition of additives to pre-formed beads involved adding 30 mg of dried quantum dot-containing beads to one or more additive solutions in ethanol (additive concentration=1 mM). The beads were then incubated in this mixture for 30 mins and then dried by vacuum.

Example 2

Addition of Additive(s) to QD-Containing Beads Contained in Larger Beads

Inner beads containing quantum dots were mixed with one or more additives and then embedded within a larger bead. The final "bead-in-bead" material was then treated by soaking as described in Example 1.

Example 3

Coating Quantum Dot-Containing Silica Beads with Polymethylmethacrylate 25 mg powdered quantum dots-containing silica beads was dispersed as well as possible in degassed methylmethacrylate (MMA). A photoinitiator, phenylbis(2,4,6-trimethylbenzoyl) phosphine oxide, was added to a crosslinker, trimethylolpropanetrimethacrylate (TMPTM), and dissolved while the solution was degassed. The TMPTM crosslinker was then added to the MMA and silica and the mixture agitated on a whirl-mixer to ensure homogeneous mixing of the monomer and crosslinker. The resulting slurry was transferred to a syringe with a wide bore needle and then continuously agitated while being injected into 5 mL of degassed 2% PVA stirring at 1200 rpm. The suspension was then exposed to 365 nm UV light for 30 minutes. The mixture was stirred overnight and worked-up the following morning by washing and centrifugation. Washes of 2×20 mL of $H_2O$ and 2×20 mL EtOH and centrifugation of 2000 rpm for 2 mins between washes. The sample was finally dried under vacuum and purged with $N_2$.

Example 4

Coating Quantum Dot-Containing Silica Beads with Polymethylmethacrylate 25 mg powdered quantum dots-containing silica beads was dispersed as well as possible in degassed methylmethacrylate (MMA). A photoinitiator, phenylbis(2,4,6-trimethylbenzoyl) phosphine oxide, was added to a crosslinker, trimethylolpropanetrimethacrylate (TMPTM), and dissolved while the solution was degassed. The TMPTM crosslinker was then added to the MMA and silica and the mixture agitated on a whirl-mixer to ensure homogeneous mixing of the monomer and crosslinker. The resulting slurry was transferred to a syringe with a wide bore needle and then continuously agitated while being injected into 5 mL of degassed 2% PVA stirring at 1200 rpm. The suspension was then exposed to 365 nm UV light for 30 minutes. The mixture was stirred overnight and worked-up the following morning by washing and centrifugation. Washes of 2×20 mL of $H_2O$ and 2×20 mL EtOH and centrifugation of 2000 rpm for 2 mins between washes. The sample was finally dried under vacuum and purged with $N_2$.

Example 5

GelestHardsil AR Coating Polymeric Bead Procedure

A stock solution of GelestHardsil AR (2000 µl) and Zn-2-ethylhexanoate (10 µl) was made. Under a $N_{2(g)}$ atmosphere, an aliquot (150 µL) of the GelestHardsil AR/Zn-2-ethylhexanoate stock solution was added to CFQD-Beads (30 mg) in a glass vial (~7 mL), incubated (overnight), placed under high vacuum (overnight) and a screw cap lid fitted to the vial. The sample was removed the glove box and placed in a preheated (220° C.) heating block mounted on a hot plate (20 min).

Example 6

Poly(Vinylalcohol) Coating Quantum Dot-Beads Procedure

A stock solution of poly(vinylalcohol) (87-89% hydrolysed, MW=85000-124000) (0.05 g) dissolved (100° C.) in ethyleneglycol (5 ml) was made. Under a $N_{2(g)}$ atmosphere, an aliquot (150 µL) of the poly(vinylalcohol)/ethyleneglycol stock solution was added to quantum dot beads, mixed and placed under high vacuum overnight to give a dry powder (QY=35%, PL=527 nm, FWHM=70 nm).

Example 7

Polymerisation Coating of Quantum Dot Beads with Glycidylmethacrylate with $BF_3$ & UV-Light Under a $N_{2(g)}$ atmosphere, a stock solution of glycidyl methacrylate (inhibitor removed) (1406 µl), $BF_3.OEt_2$ (12.3 µl) and Irgacure 819 (9 mg) was made. An aliquot (100 µl) was of the stock solution was added to quantum dot-beads (20 mg), mixed and irradiated with UV-LED (Hamamatsu UV-LED, 3 min). The samples were returned to the glove box to allow the epoxide polymerisation to proceed.

Example 8

Optocast Coating Quantum Dot-Bead Procedure

A stock solution of epoxy resin (Optocast 3553, 30 µl) dissolved in diethylether (1470 µl) was made. Under a $N_{2(g)}$ atmosphere, an aliquot (150 μL) of the Optocast/diethylether stock solution was added to quantum dot beads (30 mg), mixed, incubated (1.5 hr), placed under high vacuum overnight and irradiated (Hg-lamp, 400 W, 5 min) to give a particles (QY=30%, PL=515 nm, FWHM=70 nm).

It will be seen that the techniques described herein provide a basis for improved production of nanoparticle materials. The terms and expressions employed herein are used as terms of description and not of limitation, and there is no intention in the use of such terms of and expressions of excluding any equivalents of the features shown and described or portions thereof. Instead, it is recognized that various modifications are possible within the scope of the invention claimed.

What is claimed is:

1. A composite material comprising:
   (a) a particle comprising:
   a microbead comprising a primary matrix material;
   a population of semiconductor nanoparticles contained within the microbead, the nanoparticles comprising at least one surface-bound ligand;
   a first additive to enhance the physical, chemical and/or photo-stability of the semiconductor nanoparticles
   and, a surface coating disposed on the surface of the microbead; wherein, the primary matrix material, the surface bound ligand, the additive, and the surface coating are different materials; and
   (b) a secondary matrix material in the form of one or more secondary particles containing one or more secondary additives to enhance the physical, chemical and/or photo-stability of the semiconductor nanoparticles, wherein
   (c) the particle of (a) is dispersed within the secondary matrix material of (b) and wherein the first additive and the one or more secondary additives are the same or different.

2. A composite material according to claim 1, wherein said microbeads possess an average diameter of around 20 nm to around 0.5 mm.

3. A composite material according to claim 1, wherein said primary matrix material comprises a material selected from the group consisting of a polymer, a resin, a monolith, a glass, a sol gel, an epoxy, a silicone, and a (meth)acrylate.

4. A composite material according to claim 1, wherein said first additive mechanically seals the primary matrix material.

5. A composite material according to claim 1, wherein said first additive reduces a porosity of the primary matrix material.

6. A composite material according to claim 4, wherein said first additive is selected from the group consisting of fumed silica, ZnO, TiO$_2$, ZrO, Mg stearate, and Zn stearate.

7. A composite material according to claim 1, wherein said first additive is a capping agent.

8. A composite material according to claim 7, wherein said first additive is selected from the group consisting of tetradecyl phosphonic acid, oleic acid, stearic acid, polyunsaturated fatty acids, sorbic acid, Zn methacrylate, Mg stearate, Zn stearate, and isopropyl myristate.

9. A composite material according to claim 1, wherein said surface coating comprises a material providing the primary particle with a protective barrier to prevent the passage or diffusion of potentially deleterious species from the external environment through the matrix material to the semiconductor nanoparticles.

10. A composite material according to claim 1, wherein the surface coating is a barrier that hinders or prevents the passage of oxygen or an oxidizing agent through the primary matrix material.

11. A composite material according to claim 1, wherein the surface coating is a barrier that hinders or prevents the passage of free radical species through the matrix material.

12. A composite material according to claim 1, wherein the surface coating is a barrier that hinders or prevents moisture passing through the matrix material.

13. A composite material according to claim 1, wherein the surface coating has a thickness of up to around 500 nm.

14. A composite material according to claim 13, wherein the thickness of the surface coating is selected from the range of around 5 to 100 nm.

15. A composite material according to claim 1, wherein the surface coating comprises an inorganic material.

16. A composite material according to claim 15, wherein the inorganic material is selected from the group consisting of a dielectric, a metal oxide, a metal nitride, and a silica-based material.

17. A composite material according to claim 1, wherein the surface coating comprises a polymeric material.

18. A composite material according to claim 17, wherein the polymeric material is a saturated or unsaturated hydrocarbon polymer, or is a polymer incorporating one or more heteroatoms or heteroatom-containing functional groups.

19. A composite material according to claim 1, wherein said semiconductor nanoparticles contain ions selected from group 11, 12, 13, 14, 15 and/or 16 of the periodic table, or one or more types of transition metal ion or d-block metal ion.

20. A composite material according to claim 1, wherein said secondary matrix material comprises a material selected from the group consisting of a polymer, a resin, a monolith, a glass, a sol gel, an epoxy, a silicone, and a (meth)acrylate.

21. A light-emitting device including a primary light source in optical communication with a formulation comprising a composite material according to claim 1 embedded in a host light-emitting diode encapsulation medium.

22. A composite material comprising:
   (a) a particle comprising:
   a microbead comprising a primary matrix material;
   a population of semiconductor nanoparticles contained within the microbead, the nanoparticles comprising at least one surface-bound ligand; and
   a first additive to enhance the physical, chemical and/or photo-stability of the semiconductor nanoparticles wherein, the primary matrix material, the surface bound ligand and the first additive are different materials; and
   (b) a secondary matrix material in the form of one or more secondary particles containing one or more secondary additives to enhance the physical, chemical and/or photo-stability of the semiconductor nanoparticles, wherein the additive is selected from the group consisting of a reducing agent, a free radical scavenger, and a hydride reactive agent, and wherein (c) the particle of (a) is dispersed within the secondary matrix material of (b) and wherein the first additive and the secondary additives are the same or different.

23. A composite material according to claim 22, wherein said first additive is selected from the group consisting of ascorbic acid palmitate, alpha tocopherol, octane thiol, butylated hydroxyanisole, butylated hydroxy toluene, a gallate ester, and a metabisulfite.

24. A composite material according to claim 22, wherein said first additive is a benzophenone.

25. A composite material according to claim 22, wherein said first additive is selected from the group consisting of 1,4-butandiol, 2-hydroxyethyl methacrylate, allyl methacrylate, 1,6 heptadiene-4-01, 1,7 octadiene, and 1,4 butadiene.

* * * * *